(12) United States Patent
Shimatani et al.

(10) Patent No.: US 11,876,141 B2
(45) Date of Patent: Jan. 16, 2024

(54) ELECTRONIC DEVICE USING GRAPHENE, MANUFACTURING METHOD FOR THE DEVICE, AND ELECTROMAGNETIC WAVE DETECTOR INCLUDING THE DEVICE

(71) Applicant: Mitsubishi Electric Corporation, Tokyo (JP)

(72) Inventors: Masaaki Shimatani, Tokyo (JP); Shimpei Ogawa, Tokyo (JP); Shoichiro Fukushima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 594 days.

(21) Appl. No.: 17/057,697

(22) PCT Filed: Jan. 9, 2019

(86) PCT No.: PCT/JP2019/000376
§ 371 (c)(1),
(2) Date: Nov. 23, 2020

(87) PCT Pub. No.: WO2020/003564
PCT Pub. Date: Jan. 2, 2020

(65) Prior Publication Data
US 2021/0210643 A1 Jul. 8, 2021

(30) Foreign Application Priority Data
Jun. 28, 2018 (JP) .................................. 2018-122776

(51) Int. Cl.
*H01L 31/028* (2006.01)
*H01L 27/146* (2006.01)

(52) U.S. Cl.
CPC ...... *H01L 31/028* (2013.01); *H01L 27/14616* (2013.01); *H01L 27/14636* (2013.01); *H01L 27/14643* (2013.01); *H01L 27/14689* (2013.01)

(58) Field of Classification Search
CPC ............. H01L 31/028; H01L 27/14616; H01L 27/14636; H01L 27/14643; H01L 27/14689
(Continued)

(56) References Cited

U.S. PATENT DOCUMENTS

2013/0193412 A1 8/2013 Lee et al.
2013/0214252 A1 8/2013 Park et al.
(Continued)

FOREIGN PATENT DOCUMENTS

JP 2012-140308 A 7/2012
JP 2015-45629 A 3/2015
(Continued)

OTHER PUBLICATIONS

International Search Report and Written Opinion dated Apr. 16, 2019, received for PCT Application No. PCT/JP2019/000376, filed on Jan. 9, 2019, 11 pages including English Translation.
(Continued)

*Primary Examiner* — Jami Valentine Miller
(74) *Attorney, Agent, or Firm* — XSENSUS LLP

(57) ABSTRACT

The manufacturing method for the electronic device using graphene includes: forming a catalytic metal, forming a catalytic metal, forming a passivation film so as to expose upper surfaces of the catalytic metal and the catalytic metal, forming a graphene layer on the catalytic metal and catalytic metal that are exposed, forming a insulation film so as to cover the graphene layer, forming a substrate on the insulation film, and removing the catalytic metal.

20 Claims, 25 Drawing Sheets

(58) Field of Classification Search
USPC .......................................................... 257/72
See application file for complete search history.

(56) References Cited

U.S. PATENT DOCUMENTS

| | | | | |
|---|---|---|---|---|
| 2013/0249093 A1* | 9/2013 | Yamazaki | .......... | H01L 23/49866 |
| | | | | 977/932 |
| 2013/0264009 A1 | 10/2013 | Kimura et al. | | |
| 2014/0319357 A1 | 10/2014 | Ogawa et al. | | |
| 2015/0214303 A1 | 7/2015 | Ruhl et al. | | |
| 2015/0249034 A1 | 9/2015 | Kondo et al. | | |
| 2017/0179234 A1 | 6/2017 | Kim | | |
| 2018/0323406 A1* | 11/2018 | Li | .................... | H10K 50/82 |
| 2019/0051763 A1 | 2/2019 | Shimatani et al. | | |
| 2019/0131573 A1* | 5/2019 | Baek | .................... | H10K 77/111 |
| 2023/0147241 A1* | 5/2023 | Shimatani | .......... | H01L 27/14643 |
| | | | | 257/443 |

FOREIGN PATENT DOCUMENTS

| | | |
|---|---|---|
| JP | 2015-160794 A | 9/2015 |
| WO | 2017/145299 A1 | 8/2017 |

OTHER PUBLICATIONS

Notice of Reasons for Refusal received for Japanese Patent Application No. 2019-529948, dated Aug. 6, 2019, 14 pages including English Translation.

Notice of Reasons for Refusal received for Japanese Patent Application No. 2019-529948, dated Nov. 12, 2019, 6 pages including English Translation.

Negishi et al., "Carrier Transport Properties of the Field Effect Transistors with Graphene Channel Prepared by Chemical Vapor Deposition", Japanese Journal of Allied Physics, vol. 51, Jun. 20, 2012, pp. 06FD03-1 to 06FD03-4.

* cited by examiner

ELECTRONIC DEVICE USING GRAPHENE, MANUFACTURING METHOD FOR THE DEVICE, AND ELECTROMAGNETIC WAVE DETECTOR INCLUDING THE DEVICE

CROSS-REFERENCE TO RELATED APPLICATIONS

The present application is based on PCT filing PCT/JP2019/000376, filed Jan. 9, 2019, which claims priority to JP 2018-122776, filed Jun. 28, 2018, the entire contents of each are incorporated herein by reference.

TECHNICAL FIELD

The present invention relates to an electronic device using graphene, its manufacturing method, and an electromagnetic wave detector equipped with the device.

BACKGROUND ART

Graphene, having zero or an extremely small bandgap, has been attracting attention as a material for the electromagnetic wave detection layer to be used in the next-generation electromagnetic wave detectors. For example, an electromagnetic wave detector provided with an electronic device using graphene is proposed in which an insulation film is formed on a semiconductor substrate; a channel region made of graphene is formed on the insulation film; source and drain electrodes are formed at both ends of the graphene.

Graphene typically deposited by a thermal Chemical Vapor Deposition (CVD) method can be formed over a wide area, and also the number of the graphene layers can be controlled. However, in the method of forming the graphene layers by the thermal CVD method, since the graphene film is formed on a metal catalyst substrate, it is necessary to transfer the formed graphene film from the metal catalyst substrate to another substrate.

As a conventional transfer method of a graphene film, a method of depositing a resin layer on the graphene, peeling it from the metal catalyst substrate, and transferring it to another substrate in water is typically used. As another method for transferring a graphene film, a method including: forming a graphene film on a catalytic metal substrate; bonding it with another substrate using an adhesive resin layer having a volatile component of less than 1% by weight; and removing the catalytic metal substrate, is proposed. In this method, the graphene film can be transferred to another substrate without going through the underwater transfer process. (See Patent Document 1)

CITATION LIST

Patent Document
  Patent Document 1: Unexamined Japanese Patent Application Publication No. 2012-140308

SUMMARY OF INVENTION

Problems to be Solved by Invention

However, in the conventional manufacturing method for the electronic device using graphene, the processing steps of forming the source and drain electrodes on the graphene layer and processing the graphene layer into a channel region cause process damages in the graphene layer. The process damages in the graphene layer cause mobility reduction in the channel region and noise increase in the electronic device using graphene, which deteriorates the performance of the electronic device using graphene.

The present disclosure has been made in order to solve the above-mentioned problems of the conventional technology and to provide an electronic device using graphene whose performance is improved by suppressing the process damages in the graphene layer, the manufacturing method, and the electromagnetic wave detector equipped with the device.

Means for Solving Problems

In order to achieve the above object, the electronic device using graphene according to the present disclosure includes:
  a first substrate;
  an insulation film provided on the first substrate;
  a single-layered graphene layer provided on the insulation film, the single-layered graphene layer being to be a channel region;
  a multi-layered graphene layer provided on the insulation film and adjacent to the single-layered graphene layer; and
  a first catalytic metal that is provided on an entire upper surface of the multi-layered graphene layer and is electrically connected to the single-layered graphene layer via the multi-layered graphene layer.

In order to achieve the above object, the manufacturing method for the electronic device using graphene according to the present disclosure includes:
  forming a second catalytic metal;
  forming a third catalytic metal;
  forming a passivation film such that upper surfaces of the second catalytic metal and the third catalytic metal are exposed;
  forming, after the forming of the catalytic metals, a graphene layer on the second catalytic metal that is exposed and on the third catalytic metal that is exposed;
  forming, after the forming of the graphene layer, an insulation film so as to cover the graphene layer;
  forming, after the forming of the insulation film, a second substrate on the insulation film; and
  removing, after the forming of the graphene layer, the second catalytic metal.

Effect of Invention

According to the present disclosure, in the electronic device using graphene and its manufacturing method that are in the configuration described above, and in the electromagnetic wave detector equipped with the device, the process damages to the graphene layer can be suppressed by using a first catalytic metal, a second catalytic metal, and/or a third catalytic metal. As a result, it becomes possible to provide the electronic device using graphene with improved performance, the electromagnetic wave detector equipped with the improved device, and the manufacturing method for the device.

EMBODIMENTS FOR CARRYING OUT INVENTION

Figure 1:
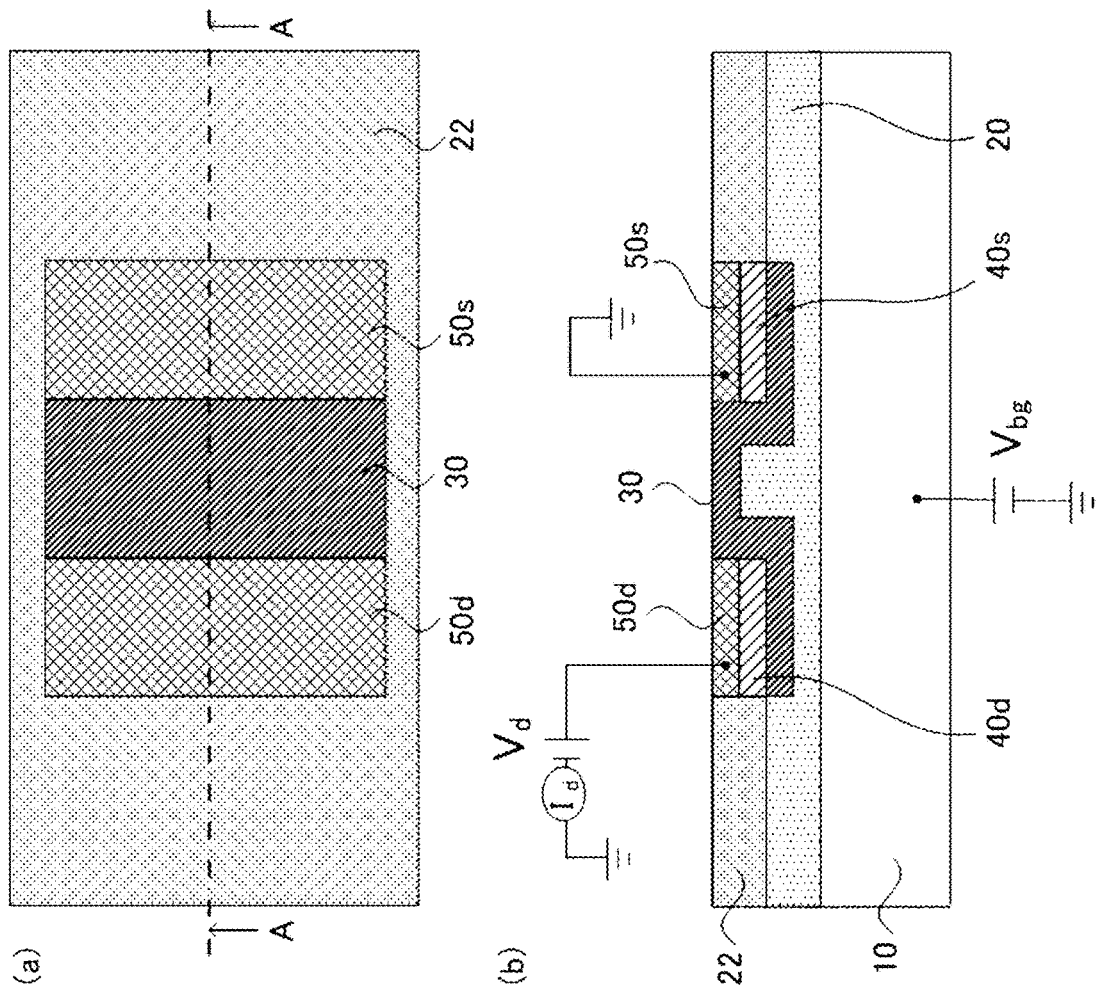
FIGS. 1(a) and 1(b) are a plan view and a cross section respectively showing a structure of an electronic device using graphene according to Embodiment 1 of the present disclosure.

First, the structure and configuration of an electronic device using graphene and an electromagnetic wave detector according to the present disclosure will be described with reference to the drawings. Note that the drawings are schematic and conceptually illustrate functions or structures. Also, note that the present disclosure is not limited to the embodiments shown hereinafter. Unless otherwise stated, the basic configuration of the electromagnetic wave detector is common in all the embodiments. In addition, those denoted by the same reference symbols are the same or the equivalents, and this description rule is common throughout the specification.

In the embodiments of the present disclosure, the electromagnetic wave detector will be described with reference to visible light or infrared light. However, the present disclosure is also effective as a detector in a radio wave region such as, for example, X-ray, ultraviolet light, near infrared light, terahertz (THz) waves, or microwaves. In the embodiments of the present disclosure, these rays of light and radio waves are collectively referred to as electromagnetic waves.

Also, in the embodiments of the present disclosure, an electronic device using graphene with a transistor structure is exemplified for electronic devices using graphene. However, the present disclosure is not limited to the transistor structure, but also applicable to a structure in which the graphene is used together with another electrode such as schottky or diode.

Further, in the embodiments of the present disclosure, as the electronic device using graphene with a transistor structure, a structure in which two electrodes that are a source electrode and a drain electrode are provided, and a structure further including a back electrode serving as a back gate in addition to the electrodes, will be described. However, the present disclosure is also applicable to an electromagnetic wave detector with another electrode structure such as a four-terminal electrode structure or a top gate structure.

Furthermore, in the embodiments of the present disclosure, the term of a p-type graphene or an n-type graphene is used for graphene. A type of graphene having more positive holes than its intrinsic state is referred to as a p-type graphene and a type of graphene having more electrons than its intrinsic state is referred to as an n-type graphene.

Further, in the embodiments of the present disclosure, the term of an n-type or a p-type is used for a contact layer provided on the graphene. In the term, the n-type indicates an electron-donor material and the p-type indicates an electron-acceptor material. In a case where there is a charge polarity bias in the entire molecules, the electron-dominated contact layer material is called an n-type; the hole-dominated contact layer is called a p-type. Either an organic or an inorganic material, or a mixture of them, can be used for these contact layers.

Also, with regard to plasmon resonance phenomena such as surface plasmon resonance phenomenon meaning an interaction between a metal surface and light, a phenomenon called pseudo surface plasmon resonance meaning resonance between a metal surface and an electromagnetic wave outside the visible light spectrum and near-near-infrared light spectrum, and a phenomenon called metamaterial or plasmonic metamaterial meaning a manipulation of a specific wavelength by a structure of a dimension less than wavelength, these phenomena are not distinguished specially by name, but are to be treated equally in terms of the effects they cause. Here, these resonances are referred to as surface plasmon resonance, plasmon resonance, or simply, resonance.

Embodiment 1

FIG. 1 illustrates a plan view and a cross sectional view showing a structure of an electronic device using graphene according to Embodiment 1 of the present disclosure. FIG. 1(a) is a plan view showing the structure of the electronic device using graphene according to the present embodiment. FIG. 1(b) is a cross section showing the structure of the electronic device using graphene according to the present embodiment, and is a cross-sectional view along the cutting line A-A in FIG. 1(a).

The electronic device using graphene according to the present embodiment incudes, as shown in FIG. 1, a substrate 10, an insulation film 20 provided on the substrate 10, a graphene layer 30 that is provided on the insulation film 20 and that serves as a channel region, catalytic metals 40s, 40d that are provided on the upper surface of the graphene layer 30 and electrically connected to the graphene layer 30, electrodes 50s, 50d provided on the catalytic metals 40s, 40d, respectively, and a passivation film 22 provided on the insulation film 20.

The substrate 10, for example, is made of a semiconductor material such as a silicon, and has a front surface and a back surface parallel and opposite to the front surface. Specifically, a substrate such as a high-resistance silicon substrate, a highly insulated substrate using a thermally oxidized film formed thereon, or an impurity-doped silicon substrate is used as the substrate 10.

The silicon substrate is exemplified above as the substrate 10. However, a substrate made of germanium, a III-V or II-V compound semiconductor, HgCdTe, InSb, lead selenide, lead sulfur, cadmium sulfur, gallium nitride, silicon carbide, a substrate including quantum wells or quantum dots, and a material of Type-II superlattice, may be used individually or in combination therewith as the substrate 10.

The insulation film 20 is provided on the surface of the substrate 10 as shown in FIG. 1(b), for which an insulation film such as made of silicon oxide can be used.

Here, as the insulation film 20, an insulation film made of silicon oxide is exemplified above. However, an insulation film made of a material such as silicon nitride, hafnium oxide, aluminum oxide, nickel oxide, boron nitride, or a polymeric material made of siloxane can also be used for the insulation film 20. For example, with its similarity in the atomic arrangement with graphene, boron nitride does not interfere with the mobility of charges, and thus the performance of graphene such as electron mobility is not impaired when in contact with graphene. Therefore, it is preferable as a base film for graphene.

As shown in FIG. 1(b), the graphene layer 30 is provided on the surface of the insulation film 20, the surface opposite to the surface on which the substrate 10 is provided. As the graphene layer 30, for example, single-layered graphene can be used. The single-layered graphene is a monoatomic layer of two-dimensional carbon crystal, and the thickness of the single-layered graphene is 0.34 nm, which is equivalent to that of one carbon atom. Further, graphene includes carbon atoms in each chain arranged in a hexagonal shape.

The graphene layer 30 is divided into a channel region and regions to function as a source layer and a drain layer. The graphene layer 30 of the regions functioning as source and drain layers is formed so as to be embedded in the insulation film 20. The graphene layer 30 of the region functioning as the channel region is provided at a position higher than upper surfaces of the graphene layer 30 of the regions functioning as the source and drain layer, and an upper surface of the graphene layer 30 for the channel region is flush with upper surfaces of the electrodes 50s, 50d, which will be described later. The graphene layer 30 of the regions functioning as the source and drain layer and the graphene layer 30 of the region functioning as the channel region are provided as one continuous layer and thus the overall graphene layer 30 has a winner podium shape.

Note here that the graphene layer 30 may be multi-layered graphene in which two or more layers are stacked. Also, the graphene layer 30 may be a non-doped graphene or a doped graphene with a p-type or an n-type impurity.

When the multi-layered graphene is used for the graphene layer 30, the photoelectric conversion efficiency of the graphene layer 30 increases and thus the sensitivity of the electromagnetic wave detector increases. Further, in the multi-layered graphene, the directions of the lattice vectors of the hexagonal lattices in arbitrary two layers of graphene may not coincide with each other, or they may completely coincide with each other. For example, by stacking two or more graphene layers, a band gap is formed in the graphene layer 30, so that it is possible to produce an effect of selecting wavelength in the electromagnetic waves subject to the photoelectric conversion. When the number of graphene layers increases, the mobility in the channel region decreases, but the influence of carrier scattering from the substrate also decreases, so that the noise decreases. As a result, in the electromagnetic wave detector having the electronic device using graphene using multi-layered graphene, the optical absorption increases and thus the detection sensitivity of the electromagnetic waves can be increased.

Further, the graphene layer 30 may be graphene in nanoribbon form. In that case, as the graphene layer 30, a structure with a single graphene nanoribbon, a structure in which a plurality of graphene nanoribbons are stacked, or a structure in which graphene nanoribbons are periodically arranged on a plane can be employed.

For example, in the case of the structure in which the graphene nanoribbons are periodically arranged, the sensitivity of the electromagnetic wave detector can be improved by exciting plasmon resonance in the graphene nanoribbons. Here, the structure in which graphene nanoribbons are arranged periodically is sometimes referred to as a graphene metamaterial, but the phenomenon therein is the same.

As shown in FIG. 1(b), the catalytic metals 40s, 40d are separated from each other and the two of them constitute a pair of catalytic metals, which are provided on the upper surfaces of the graphene layer 30 of the regions functioning as the source and drain layers. As the catalytic metals 40s, 40d, for example, a metal material such as Cu, Ni, Al, Fe, Co, W, or Cr can be used. Further, as shown in FIG. 1, the graphene layer 30 is provided on the entire bottom surfaces of the catalytic metals 40s, 40d.

As shown in FIG. 1(b), the electrodes 50s, 50d are provided on the upper surfaces of the catalytic metals 40s, 40d, respectively, and are made of a metal material such as Au, Ag, Cu, Al, Ni, Cr, or Pd. In a case of depositing the graphene layer 30 by the thermal CVD method, since the film forming temperature may exceed 1000 degrees C. in some cases, a metal or a conductive carbon material having a melting point of 1000 degrees C. or higher may be used for the electrodes 50s, 50d. In addition, an adhesion film (not shown) made of Cr or Ti may be provided between the electrode 50s and the catalytic metal 40s or between the electrode 50d and the catalytic metal 40d.

The electrodes 50s, 50d are provided on the entire upper surfaces of the catalytic metals 40s, 40d, respectively, in a way that the upper surfaces of the electrodes 50s, 50d are flush with the upper surface of the graphene layer 30 of the region functioning as the channel region. The graphene layer 30 of the region functioning as the channel region is provided between the electrodes 50s, 50d. That is, the electrodes 50s, 50d are separated from each other; the two of them constitute a pair of electrodes and each of them has the same rectangular shape in the plan view as shown in FIG. 1(a). In the present embodiment, the catalytic metal 40s and the electrode 50s together constitute a source electrode, and the catalytic metal 40d and the electrode 50d together constitute a drain electrode.

As shown in FIG. 1, the passivation film 22 on the insulation film 20 is provided so as to surround the periphery of the graphene layer 30, the catalytic metals 40s, 40d, and the electrodes 50s, 50d. As the passivation film 22, for example, an insulation film made of silicon oxide can be used. The upper surface of the passivation film 22 is flush with the upper surface of the graphene layer 30 in the region functioning as the channel region and the upper surfaces of the electrodes 50s, 50d.

Here, as the passivation film 22, an insulation film made of silicon oxide is exemplified above, but an insulation film such as an oxide or a nitride may be used.

In order to selectively grow the graphene layer 30 functioning as the channel region on the catalytic metal 42 described later, the passivation film 22 needs to be made of a material which suppresses the growth of the graphene layer in the region except for that of the graphene layer 30 functioning as the channel region. If the thermal CVD method is to be used to form the graphene layer 30, an insulating material that does not melt in the process of the thermal CVD method is preferably used for the passivation film 22.

As shown in FIG. 1(b), in the electronic device using graphene according to the present embodiment, a power supply circuit for applying a back-gate voltage Vbg is electrically connected to the substrate 10, a power supply circuit for applying a voltage Vd to the graphene layer 30 is electrically connected to the electrode 50d serving as the drain electrode, and the electrode 50s serving as the source electrode is grounded. An ammeter to detect the current Id flowing in the graphene layer 30 between the electrodes 50d and the electrode 50s is connected to the power supply circuit connected to the electrode 50d.

The electronic device using graphene according to the present embodiment is structured as described above.

Figure 2:
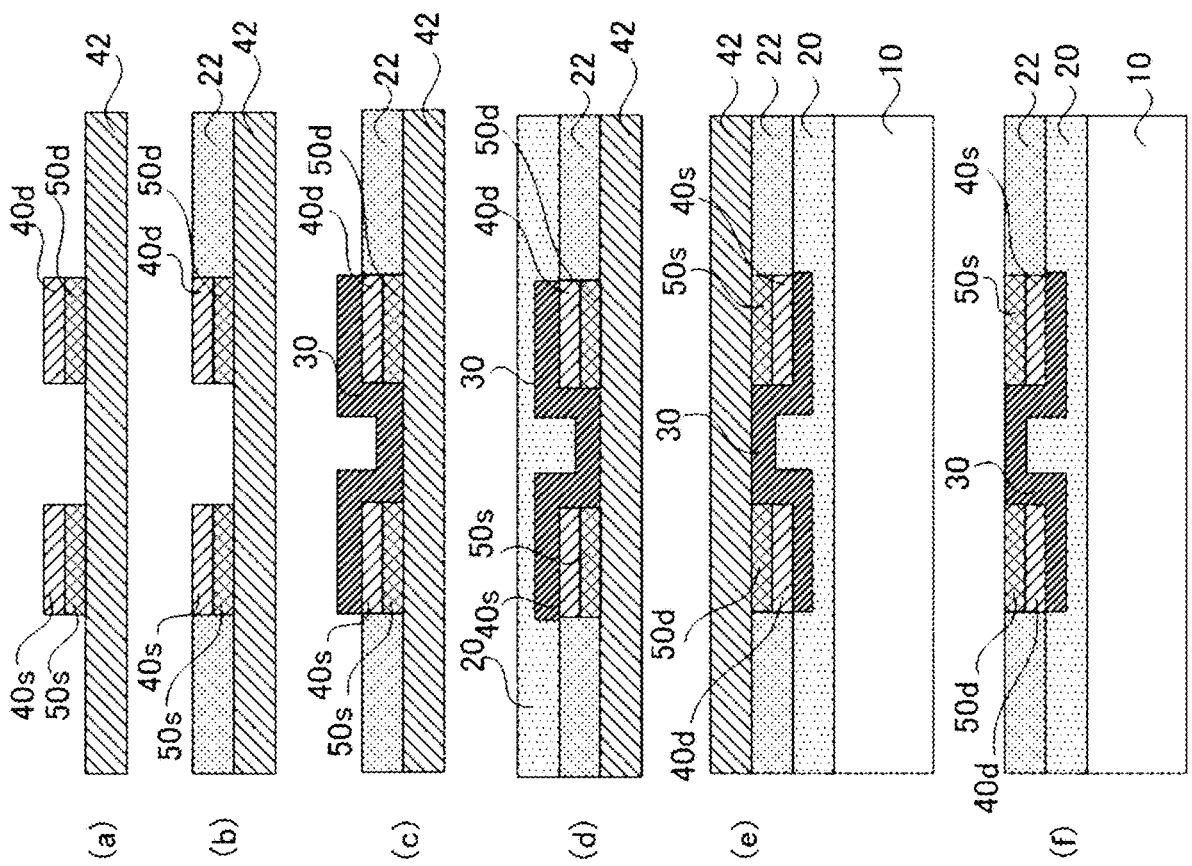
FIG. 2 is a cross section showing the manufacturing method for the electronic device using graphene according to Embodiment 1 of the present disclosure.

Next, a manufacturing method for the electronic device using graphene according to the present embodiment will be described. FIG. 2 is cross sections each showing a production process of the electronic device using graphene according to the present embodiment, in which each cross section is along the section line A-A in FIG. 1(a).

First, metal films for the electrodes 50s, 50d and the catalytic metals 40s, 40d are deposited on the catalytic metal 42. Then, the catalytic metal 42 is exposed while the portions to become the electrodes 50s, 50d and the catalytic metals 40s, 40d are left. For example, a catalytic metal 42 such as a flat copper foil is formed, and then a resist mask having an opening is formed on the catalytic metal 42 using photolithography, electron beam (EB) lithography, or the like. Then, the metal layer of the electrodes 50s, 50d and the metal layer of the catalytic metals 40s, 40d are deposited in this order by using EB evaporation or a sputter deposition method. Then, the metal films formed except for in the opening are lifted off together with the resist mask. By the steps described above, the catalytic metals 40s, 40d and the electrodes 50s, 50d are formed on the catalytic metal 42 as shown in FIG. 2(a).

As the metal material of the catalytic metal 42, for example, Cu, Ni, Al, Fe, Co, W, or Cr can be used. Alternatively, the catalytic metal 42 may be formed on another substrate, and the metal layer of the catalytic metals 40s, 40d and the metal layer of the electrodes 50s, 50d may be formed on the another substrate on which the catalytic metal 42 is formed. In addition, an adhesion film (not shown) made of Cr, Ti or the like may be formed between the electrodes 50s and the catalytic metal 40s and/or between the electrodes 50d and the catalytic metal 40d.

Alternatively, as a method of forming the catalyst metals 40s, 40d and the electrodes 50s, 50d, the following method is also available: first, the metal layers are deposited on the catalytic metal 42 in the order of the electrodes 50s, 50d and the catalytic metals 40s, 40d; next, a resist mask having an opening is formed on the metal layers by using photolithography or the like; and, after that, the metal layer exposed in the opening of the resist mask is removed by wet etching, dry etching, or the like. As a result, the catalytic metals 40s, 40d and the electrodes 50s, 50d are formed on the catalytic metal 42.

Next, by using vapor deposition, a CVD method, an atomic layer deposition (ALD) method or the like, a passivation film 22 made of, for example, a silicon oxide film is formed so as to cover the catalytic metal 42, the catalytic metals 40s, 40d, and the electrodes 50s, 50d. Then, as shown in FIG. 2(b), by removing the passivation film 22 which is formed between the catalytic metals 40s, 40d and the electrodes 50s, 50d, and on the catalytic metal 42 by, for example, an etching process, the catalytic metals 40s, 40d and 42 are exposed.

Alternatively, as a method of forming the passivation film 22, the following method is also available: first, a region in which the passivation film 22 is not to be formed is masked by a resist mask using photolithography or the like; then, the passivation film 22 is deposited by evaporation, a CVD method, or an ALD method or the like; and then, the unnecessary passivation film is removed together with the resist mask.

Next, as shown in FIG. 2(c), by using, for example, a thermal CVD method or a plasma CVD method, the graphene layer 30 is formed selectively on the upper surfaces of the catalytic metals 40s, 40d as well as on a part of the upper surface of the catalytic metal 42, all exposed from the passivation film 22. For example, in a case of the thermal CVD method, the inside of the CVD chamber is heated up to 1000 degrees C., and H2 gas and CH4 gas are injected into the CVD chamber to form the graphene layer 30. For example, in a case of the plasma CVD method, it is possible to use the low temperature plasma CVD method so that the metal materials of the catalytic metals 40s, 40d, the electrodes 50s, 50d, and the catalytic metal 42 will not melt or become an alloy together.

Next, as shown in FIG. 2(d), the insulation film 20 made of, for example, silicon oxide is formed on the upper surfaces of the graphene layer 30 and the passivation film 22 by using, for example, a solution coating method such as spin coating method, a physical evaporation method such as a vacuum evaporation method, or a chemical vapor deposition method so-called CVD method. Then, in order to bond the upper surface of the insulation film 20 and the substrate 10 together, the upper surface of the insulation film 20 should be planarized before bonding.

Next, as shown in FIG. 2(e), the upper surface of the planarized insulation film 20 and the substrate 10 are attached to each other and bonded together.

As a method of attaching and bonding the upper surface of the insulation film 20 and the substrate 10 together, a compression bonding method such as heating and pressing the substrate 10 to bond to the insulation film 20 or applying an adhesive on and pressure to the substrate 10 to bond to the insulation film 20 is available. In a case where the insulation film 20 is formed by the solution coating method, after the material of the insulation film 20 is applied, the substrate 10 is pressed against the film and heated, so that the insulation film 20 and the substrate 10 can be bonded. In a case where a spin coating method using, for example, a spin-on glass (SOG) is used to deposit the insulation film 20, the following steps are performed: applying the SOG; immediately thereafter, attaching the SOG to the substrate 10; annealing them at 100 degrees C.; and further annealing them at 250 degrees C. As a result, the SOG is converted into glass, so that it can be bonded to the substrate 10.

If the gate voltage is applied from the substrate 10, a conductive semiconductor material such as a silicon substrate doped with impurity ions, or a metal material should be used for the substrate 10. If the gate voltage is not applied from the substrate 10, the substrate 10 may be made of a material except for those mentioned above: for example, a transparent inorganic material such as quartz or glass, a transparent substrate such as transparent plastic, an ultraviolet curable resin, a thermosetting resin, or a thermoplastic resin. Alternatively, a flexible substrate may be used as the substrate 10. In that case, the insulation film 20 and the substrate 10 can be bonded together using a roll-to-roll method.

Then, as shown in FIG. 2(f), the catalytic metal 42 is removed by an etching method or a peeling method to expose a part of the graphene layer 30 and the electrodes 50s, 50d. If an etching method is used, the types of etching are not particularly limited as long as only the catalytic metal 42 can be selectively removed. For example, dry etching or wet etching can be used. If the wet etching is used, a material in which the catalytic metal 42 is selectively dissolved should be selected as an etchant. For example, if the catalytic metal 42 is a copper foil, a copper-selective etching solution is used. If the peeling method is used for removing the catalytic metal 42, the following methods are available: mechanically peeling the catalytic metal 42; peeling the catalytic metal 42 made of a hydrophobic material from the passivation film 22 made of a hydrophilic material by radiating ultrasonic waves in water; or peeling the catalytic metal 42 with bubbles generated by the electrochemical reaction caused in an electrolytic solution by using the catalytic metal 42 as an electrode.

So far, the step of removing the catalytic metal 42 is described, but if an electrical signal can be taken out from the electrodes 50s, 50d, the catalytic metal 42 may be oxidized, instead of removed, so as to be used, for example, as an insulation film or a passivation film. In addition, after the catalytic metal 42 is removed, the passivation film 22 may be removed.

As described so far, the electronic device using graphene according to the present embodiment can be produced.

Next, the operation principle of the electronic device using graphene according to the present embodiment used as an electromagnetic wave detector will be described with reference to FIG. 1.

As shown in FIG. 1(b), as the power supply circuit applying the voltage Vd between the electrodes 50s, 50d is electrically connected, the current Id flows in the graphene layer 30 between the electrodes 50s, 50d. The current Id flowing in the graphene layer 30 is monitored by the ammeter.

Then, when electromagnetic waves the are radiated to the graphene layer 30, photoelectric conversion occurs in the graphene layer 30, and the resistance value in the graphene layer 30 changes. Due to this change in the resistance value, the current Id, being the photocurrent, flowing through the graphene layer 30 changes. By detecting the change in the current Id, it is possible to detect the radiated electromagnetic waves.

Further, by applying the back-gate voltage Vbg from the substrate 10, the charge density in the graphene layer 30 can be adjusted. As a result, the extraction efficiency of the photocurrent flowing in the graphene layer 30 can be improved, and the detection sensitivity of the radiated electromagnetic waves can be increased.

Further, graphene has sensitivity to perform photoelectric conversion for the wavelength range of wide band electromagnetic waves. Therefore, the graphene layer 30 causes a change in current within the wavelength range of wide band electromagnetic waves. Therefore, in a case when the electronic device using graphene according to the present embodiment is used as an electromagnetic wave detector, it is possible to detect electromagnetic waves having a wide band wavelength range such as from ultraviolet light to radio waves.

However, the configuration is not limited to the configuration described above to detect the change in the current of the graphene layer 30, but any configuration that enables the device to detect the change in the amount of electricity occurring in the graphene layer 30 can be employed. For example, a configuration in which a constant current is applied between the electrodes 50s, 50d and a change in the voltage value of the graphene layer 30 therebetween can be detected and a configuration in which only one of the electrodes 50s, 50d is formed and an electric potential change of the graphene layer 30 can be detected may be available.

Alternatively, there is another method to detect electromagnetic waves as follows: two electronic devices using graphene with the same graphene are prepared; one of these two electronic devices using graphene is placed in a shielded space where electromagnetic waves are not radiated; and the electromagnetic waves are detected by measuring the difference between the current or voltage of the electronic device using graphene irradiated by the electromagnetic waves and the current or voltage of the electronic device using graphene placed in the shielded space.

Next, effects of the electronic device using graphene and its manufacturing method according to the present embodiment will be described.

The electronic device using graphene according to the present embodiment is produced by the following steps: first, the graphene layer 30 is selectively formed using the catalytic metals 40 and 42; next, the formed graphene layer 30 is covered with the insulation film 20; then, the insulation film 20 and the substrate 10 are bonded together; and finally, the catalytic metal 42 is removed.

In contrast, the conventional method for producing an electronic device using graphene includes forming a channel region and forming electrodes, after a graphene layer is formed. More specifically, the following steps are performed: first, the graphene layer is formed on a substrate; next, an unnecessary graphene layer is removed by etching or the like thus to form a channel region; then, in order to form electrodes on the graphene layer that remains as the channel region, steps of forming a resist mask and metal films to be electrodes are performed. However, the steps of etching when forming the channel region, forming the resist mask when making the electrodes, and forming the metal film cause process damages in the graphene layer. The process damages result in the performance deterioration of the electronic device using graphene, such as a decrease in the mobility in the channel region of the graphene layer and an increase of noises of the electronic device using graphene.

However, the electronic device using graphene according to the present embodiment can be produced without going through the steps of forming the electrodes and forming the channel region after the graphene layer 30 is formed. In other words, the formed graphene layer 30 does not suffer the process damages due to the above-described steps: etching when forming the channel region, forming the resist mask when forming the electrodes, and forming the metal film Therefore, the electronic device using graphene according to the present embodiment can improve the performance as compared with the conventional one.

Further, the electronic device using graphene according to the present embodiment can be produced without using the conventional transfer process in water when forming the graphene layer. Therefore, the electronic device using graphene can be produced more easily than before, and the mass productivity can be improved.

Furthermore, in the production process of the electronic device using graphene according to the present embodiment, the graphene layer 30 is selectively grown from the catalytic metals 40s, 40d. As a result, the graphene layer 30 is uniformly formed on the catalytic metals 40s, 40d, and foreign matters including dust is not mixed between the graphene layer 30 and the catalytic metals 40s, 40d. Therefore, the contact resistance between the graphene layer 30 and the catalytic metals 40s, 40d can be suppressed, and the performance of the electronic device using graphene can be improved.

In the present embodiment, the electronic device using graphene with the electrodes 50s, 50d is described as an example. Alternatively, however, if the catalytic metals 40s, 40d are used as electrodes, the electrodes 50s, 50d may not be provided. In that case, in the manufacturing method for the electronic device using graphene according to the present embodiment, the step of forming the electrodes 50s, 50d can be omitted.

By setting the thickness of the catalytic metals 40s, 40d to several tens of nm or less, the carrier doping from the catalytic metals 40s, 40d to the graphene layers 30s, 30d can be made negligibly small, and as a result, the carrier doping from the electrodes 50s, 50d to the graphene layers 30s, 30d becomes dominant.

Embodiment 2

An electronic device using graphene according to Embodiment 2 of the present disclosure is different form Embodiment 1 in that single-layered graphene is formed in the portion corresponding to the channel region of the graphene layer, and multi-layered graphene is formed in the portions corresponding to the source and drain regions of the graphene layer. Since other parts with the same symbols are formed and structured in the same manner as in the electronic device using graphene of Embodiment 1, the description is omitted.

Figure 3:
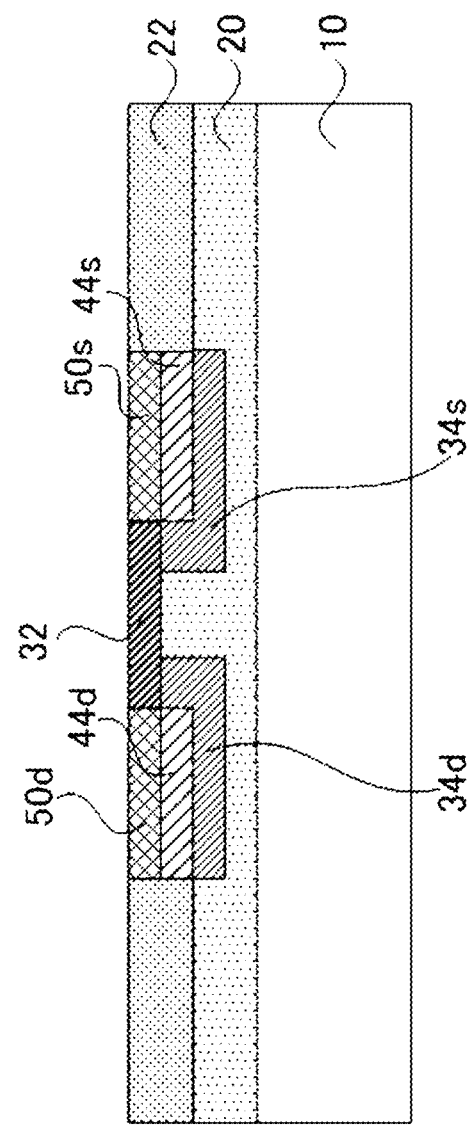
FIG. 3 is a cross section showing the structure of an electronic device using graphene according to Embodiment 2 of the present disclosure.

FIG. 3 is a cross section showing the structure of the electronic device using graphene according to the present embodiment, which is along the section line A-A in FIG. 1, as in the case of Embodiment 1.

As shown in FIG. 3, the electronic device using graphene according to the present embodiment includes a graphene layer 32 made of single-layered graphene in the portion corresponding to the channel region of the graphene layer and graphene layers 34s, 34d made of multi-layered graphene in the portions corresponding to the source and drain regions of the graphene layer.

The graphene layer 32, made of single-layered graphene, is provided between the electrodes 50s, 50d and functions as a channel region. The upper surface of the graphene layer 32 is flush with the upper surfaces of the electrodes 50s, 50d as in Embodiment 1.

The graphene layers 34s, 34d, made of multi-layered graphene, are provided in the portions corresponding to the source and drain regions. The graphene layers 34s, 34d are provided as one continuous layer with the graphene layer 32.

On the multi-layered graphene layers 34s, 34d, catalytic metals 44s, 44d made of metal material such as Ni on which the multi-layered graphene are to be selectively formed, for example, are provided. The catalytic metals 44s, 44d have the multi-layered graphene layers 34s, 34d on their entire bottom surfaces, respectively. Therefore, the catalytic metals 44s, 44d are electrically connected to the single-layered graphene layer 32 via the multi-layered graphene layer 34s, 34d, respectively.

The other parts of the structure are the same as in the structure of the electronic device using graphene according to Embodiment 1.

Next, the manufacturing method for the electronic device using graphene according to the present embodiment will be described with reference to FIG. 2 of Embodiment 1. The description of the same production steps as in Embodiment 1 is omitted, and only the production steps of FIG. 2(a) and FIG. 2(c), which are different from those in Embodiment 1, will be described.

As shown in FIG. 2(a), for the catalytic metal 42, a metal material that can selectively form single-layered graphene such as a flat copper foil is prepared. Then, a resist mask having an opening is formed on the catalytic metal 42 by using photolithography or EB lithography. After that, the metal layers of the electrodes 50s, 50d and the metal films of the catalytic metals 44s, 44d, the metal films being the replacements of the catalytic metals 40s, 40d shown in FIG. 2(a), are deposited in this order by EB evaporation or a sputter deposition method. Next, the metal films formed except for in the opening are lifted off together with the resist mask to form the catalytic metals 44s, 44d and the electrodes 50s, 50d on the catalytic metal 42. At this time, as the metal layer of the catalytic metals 44s, 44d, a metal material on which multi-layered graphene can be selectively formed, for example, a metal film made of Ni, is used.

Then, after going through the process of forming the passivation film 22 shown in FIG. 2(b), on the upper surfaces of the catalytic metals 44s, 44d, which are the replacements of the catalytic metals 40s, 40d of FIG. 2(c), and a part of the upper surface of the catalytic metal 42—which are all exposed from the passivation film 22, the graphene layers are selectively formed by using, for example, the thermal CVD method or the plasma CVD method. At this time, the single-layered graphene layer 32 is selectively formed on the surface where the catalytic metal 42 made of, for example, a copper foil is exposed; the multi-layered graphene layers 34$s$, 34$d$ are selectively formed on the surface where the catalytic metals 44$s$, 44$d$ made of, for example, Ni are exposed.

The production steps, following thereafter, of the electronic device using graphene according to the present embodiment are the same as those in the manufacturing method for the electronic device using graphene according to Embodiment 1.

Next, effects of the electronic device using graphene and its manufacturing method according to the present embodiment will be described.

In the electronic device using graphene according to the present embodiment, after the graphene layers 32, 34$s$ and 34$d$ are formed, they do not suffer the process damages due to the previously-mentioned processing steps performed when forming the channel region: etching, forming the resist mask when forming the electrodes, and forming the metal film. Therefore, the electronic device using graphene according to the present embodiment can improve the performance. The details are the same as Embodiment 1 and are omitted here. Further, the electronic device using graphene according to the present embodiment can be produced without using the conventional transfer process in water as in Embodiment 1, and thus the mass productivity can be improved. In addition, in the electronic device using graphene according to the present embodiment, as in Embodiment 1, the graphene layers 34$s$, 34$d$ are selectively grown from the catalytic metals 44$s$, 44$d$, and thus the graphene layers 34$s$, 34$d$ are provided on the entire bottom surfaces of the catalytic metals 44$s$, 44$d$. As a result, the contact resistance between the graphene layers 34$s$, 34$d$ and the catalytic metals 44$s$, 44$d$ can be suppressed, and thus the performance of the electronic device using graphene can be improved.

Further, in the electronic device using graphene according to the present embodiment, the single-layered graphene layer 32 is formed in the portion corresponding to the channel region of the graphene layer, and the multi-layered graphene layers 34$s$, 34$d$ are formed in the portions corresponding to the source and drain regions of the graphene layer. The effects of the structure shown above will be described in detail below.

Generally, carriers are doped from an electrode formed on a graphene layer into the graphene layer. For example, in a case of an Au electrode, holes are doped into the graphene near the electrode due to the difference in work function between the graphene and Au. When the electronic device using graphene in this condition is driven in an electron conducting state, the mobility of electrons flowing in the channel is suppressed by the influence of holes which are doped into the graphene from the electrode. As a result, the contact resistance between the graphene and the electrode increases. The increase in the contact resistance reduces the electron field-effect mobility of the electronic device using graphene and thus degrades the performance of the electronic device using graphene. Especially in the case of the single-layered graphene, the amount of carrier dope injected from the electrode into the graphene is large and thus the decrease in the electron field-effect mobility of the electronic device using graphene is remarkable. Therefore, if all of the graphene layers are formed by the single-layered graphene, the performance of the electronic device using graphene will be degraded.

However, in the electronic device using graphene according to the present embodiment, the multi-layered graphene is formed in the portions corresponding to the source and drain regions being the graphene layer into which the carriers from the electrode are easily doped. Compared to the single-layered graphene, the multi-layered graphene has reduced carrier doping from the electrode, and thus it is possible to suppress the increase in contact resistance between the graphene layer and the electrode. Therefore, mobility decrease in the electron field effect of the electronic device using graphene can be suppressed, and as a result, the performance of the electronic device using graphene can be improved as compared with Embodiment 1.

Also, since the single-layered graphene is used for the channel region instead of using the multi-layered graphene, high mobility can be obtained. Therefore, the above-mentioned increase in contact resistance can be suppressed and high mobility can be maintained. As a result, the performance of the electronic device using graphene can be improved.

Further, in the electronic device using graphene according to the present embodiment, the multi-layered graphene is formed directly from the catalytic metals 44$s$, 44$d$, and thus the graphene layers 34$s$, 34$d$ are formed on the entire bottom surfaces of the catalytic metals 44$s$, 44$d$. This makes it possible to reduce the contact resistance between the catalytic metals 44$s$, 44$d$ and the multi-layered graphene layers 34$s$, 34$d$, and as a result, the performance of the electronic device using graphene can be improved.

Embodiment 3

An electronic device using graphene according to Embodiment 3 of the present disclosure is different from those in other embodiments in that the metal materials of the electrodes are different in kind to each other. Since other parts with the same symbols are formed and structured in the same manner as in the electronic devices using graphene according to other embodiments, the description is omitted.

Figure 4:
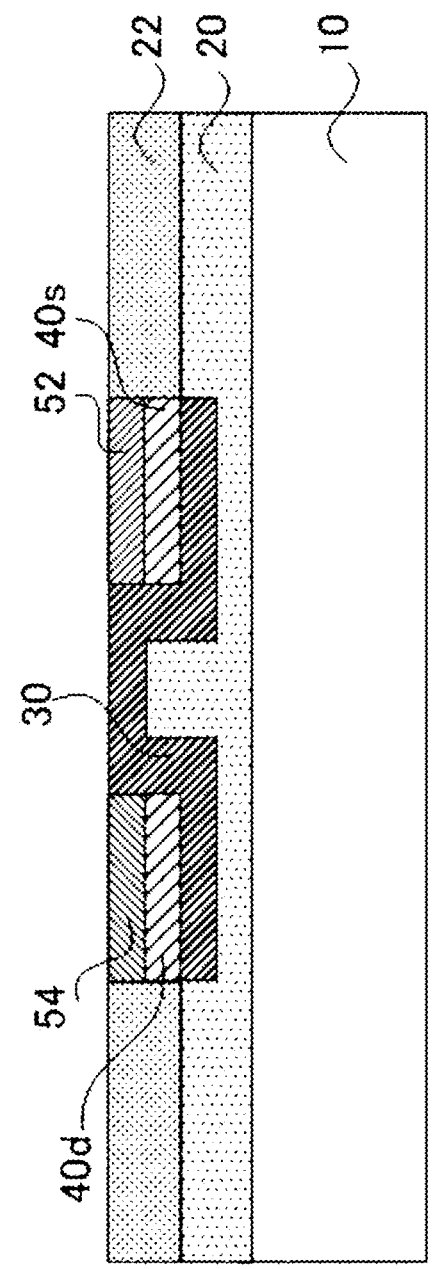
FIG. 4 is a cross section showing the structure of an electronic device using graphene according to Embodiment 3 of the present disclosure.

FIG. 4 is a cross section showing the structure of the electronic device using graphene according to the present embodiment, which is along the section line A-A in FIG. 1, as in the case of Embodiment 1.

In the electronic device using graphene according to the present embodiment, as shown in FIG. 4, the metal materials of electrodes 52 and 54 that are a pair of electrodes are different in kind to each other. As the metal materials of the electrodes 52 and 54, for example, two kinds of metal materials different to each other are appropriately selected from metals such as Au, Ag, Cu, Al, Ni, Cr, or Pd.

Next, the manufacturing method for the electronic device using graphene according to the present embodiment will be described with reference to FIG. 2 of Embodiment 1. The description of the same production steps as in Embodiment 1 is omitted, and only the production step of FIG. 2($a$), which is different from that in Embodiment 1, will be described.

The manufacturing method for the electronic device using graphene according to the present embodiment includes the following steps: first, the catalytic metal 42 is prepared; then, as shown in FIG. 2($a$), a resist mask having an opening corresponding to the position of the electrode 52 and the catalytic metal 40$s$ is formed on the catalytic metal 42 using photolithography or EB lithography; after that, the metal layers of the electrode 52 and the catalytic metal 40s are deposited in this order using EB evaporation or a sputter deposition method; and the metal films formed except for in the opening are lifted off together with the resist mask. By the steps described above, the catalytic metal 40s and the electrode 52 are formed on the catalytic metal 42. Regarding the catalytic metal 40d and the electrode 54, using the same steps as used for the catalytic metal 40s and the electrode 52, the catalytic metal 40d and the electrode 54 whose metal material is different from the electrode 52 are formed.

The production steps following thereafter of the electronic device using graphene according to the present embodiment are the same as those in the manufacturing method for the electronic device using graphene according to Embodiment 1.

Next, effects of the electronic device using graphene and its manufacturing method according to the present embodiment will be described.

In the electronic device using graphene according to the present embodiment, after the graphene layer 30 is formed, it does not suffer the process damages due to the previously-mentioned processing steps performed when forming the channel region: etching, forming the resist mask when forming the electrodes, and forming the metal film Therefore, the electronic device using graphene according to the present embodiment can improve the performance. The details are the same as Embodiment 1 and are omitted here. Further, the electronic device using graphene according to the present embodiment can be produced without using the conventional transfer process in water as in Embodiment 1, and thus the mass productivity can be improved. In addition, in the electronic device using graphene according to the present embodiment, as in Embodiment 1, the graphene layers 30 is selectively grown from the catalytic metals 40s, 40d, and thus the graphene layer 30 is provided on the entire bottom surfaces of the catalytic metals 40s, 40d. As a result, the contact resistance between the graphene layer 30 and the catalytic metals 40s, 40d can be suppressed, and thus the performance of the electronic device using graphene can be improved.

Further, in the electronic device using graphene according to the present embodiment, the electrodes 52 and 54 corresponding to the source and drain electrodes are each formed of a metal material different in kind to each other. In graphene, the Fermi level shifts according to the type of metal with which the graphene contacts, and thus the graphene has different contact resistance. Therefore, when the metal materials of the electrodes 52 and 54 are different in kind to each other, the work functions of the electrodes 52 and 54 are also different, and thus a carrier density gradient, for example, is generated in the graphene layer 30 between the electrodes 52 and 54. As a result, the current extraction efficiency of the electronic device using graphene is improved. Therefore, when the electromagnetic waves are radiated to an electromagnetic wave detector with the electronic device using graphene according to the present embodiment, the photocurrent flowing between the electrode 52 and the electrode 54 is increased by the carrier generated in the graphene layer 30, and thus the sensitivity of the electromagnetic wave detector can be improved.

Note here that the structure of the electronic device using graphene according to the present embodiment can also be applied to other embodiments.

Embodiment 4

An electronic device using graphene according to Embodiment 4 of the present disclosure is different from other embodiments in that it has a contact layer on the graphene layer. Since other parts with the same symbols are formed and structured in the same manner as in the electronic devices using graphene according to other embodiments, the description is omitted.

Figure 5:
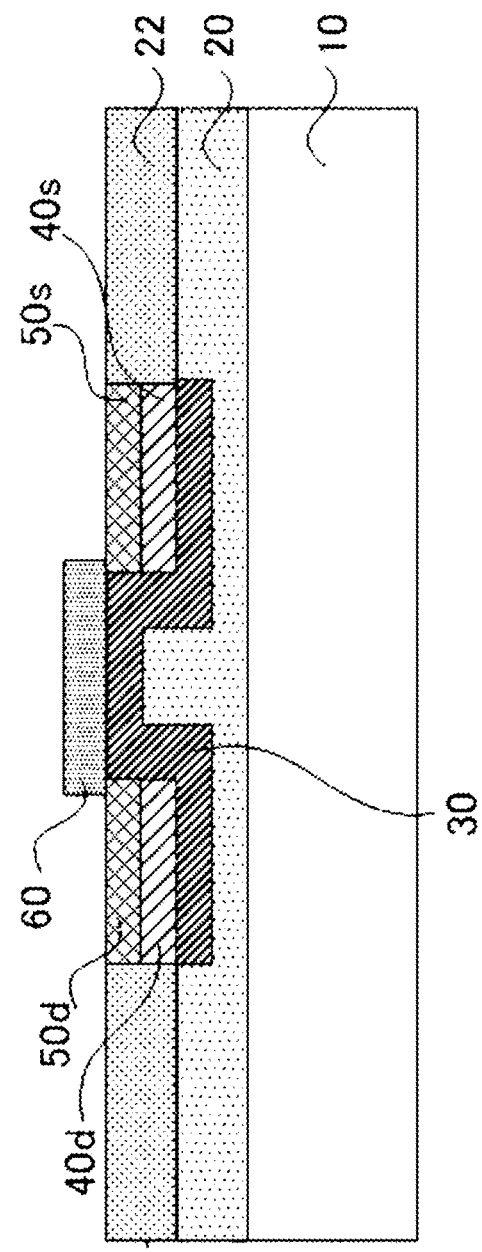
FIG. 5 is a cross section showing the structure of an electronic device using graphene according to Embodiment 4 of the present disclosure.

FIG. 5 is a cross section showing the structure of the electronic device using graphene according to the present embodiment, which is along the section line A-A in FIG. 1, as in the case of Embodiment 1.

As shown in FIG. 5, the electronic device using graphene according to the present embodiment has a contact layer 60 on the graphene layer 30. The contact layer 60 can supply holes or electrons to the graphene layer 30 by contacting with the graphene layer 30. That is, the contact layer 60 can be used to dope holes or electrons to the graphene layer 30 as a necessary basis.

Further, for the contact layer 60, for example, a composition called a positive photoresist, which contains a quinonediazito group-containing photosensitizer and a novolak resin, can be used.

Furthermore, for the contact layer 60, a material having, for example, a polar group can be used. For example, a material having an electron withdrawing group has an effect of reducing the electron density of the graphene layer 30, and a material having an electron donating group has an effect of increasing the electron density of the graphene layer 30. As a material having an electron withdrawing group, for example, a material having halogen, nitrile, a carboxyl group, a carbonyl group, or the like can be used. As a material having an electron donating group, for example, a material having an alkyl group, alcohol, an amino group, a hydroxyl group, or the like can be used. Materials except for the above, in which charges are biased in the entire molecule depending on polar groups, can also be used as the material of the contact layer 60.

In addition, from among an organic matter, a metal, a semiconductor, an insulator, a two-dimensional material, or a mixture of any of these materials, any material that generates polarity due to biased charge in the molecule can be used as the material for the contact layer 60. The following is known about graphene doping. In a case where the contact layer of an inorganic material and the graphene are contacted with each other, when the work function of the contact layer is larger than the work function of the graphene, the graphene is doped p-type, and when smaller, the graphene is doped n-type. On the other hand, in a case where the contact layer is an organic matter, it does not have a clear work function. Therefore, whether the graphene is doped n-type or p-type depends on the polarity of the molecule used for the contact layer 60, and it should be determined based on the polar group of the material of the contact layer 60.

Next, the manufacturing method for the electronic device using graphene according to the present embodiment will be described with reference to FIG. 5.

In the production of the electronic device using graphene according to the present embodiment, the same steps as the steps from FIG. 2(a) to (f) shown in Embodiment 1 are used. After FIG. 2(f), the contact layer 60 is formed on the graphene layer 30 as shown in FIG. 5.

For example, if a composition called a positive photoresist, which contains a quinonediazito group-containing photosensitizer and a novolak resin, is used for the contact layer 60, the region where the resist is formed by the photolithography process comes to a p-type graphene region. With this structure, the mask forming process is not required, so that process damage can be reduced, and the process can be simplified.

Next, effects of the electronic device using graphene and its manufacturing method according to the present embodiment will be described.

In the electronic device using graphene according to the present embodiment, after the graphene layer 30 is formed, it does not suffer the process damages due to the previously-mentioned processing steps performed when forming the channel region: etching, forming the resist mask when forming the electrodes, and forming the metal film. Therefore, the electronic device using graphene according to the present embodiment can improve the performance. The details are the same as Embodiment 1 and are omitted here. Further, the electronic device using graphene according to the present embodiment can be produced without using the conventional transfer process in water as in Embodiment 1, and thus the mass productivity can be improved. In addition, in the electronic device using graphene according to the present embodiment, as in Embodiment 1, the graphene layers 30 is selectively grown from the catalytic metals 40s, 40d, and thus the graphene layer 30 is provided on the entire bottom surfaces of the catalytic metals 40s, 40d. As a result, the contact resistance between the graphene layer 30 and the catalytic metals 40s, 40d can be suppressed, and thus the performance of the electronic device using graphene can be improved.

Also, the electronic device using graphene according to the present embodiment has the contact layer 60 formed on the graphene layer 30. As described above, as the material of the contact layer 60, for example, a material having an electron withdrawing group or a material having an electron donating group is used to intentionally change the state of the graphene layer 30 either to an n-type or a p-type graphene layer. Therefore, the carrier doping of the graphene layer 30 can be controlled without considering the influence of the carrier doping from the catalytic metals 40s, 40d or the electrodes 50s, 50d. As a result, the performance of the electronic device using graphene can be improved.

Note here that, in the electronic device using graphene according to the present embodiment, a plurality of contact layers may be stacked on the graphene layer 30, and the stacked contact layers may be formed in plurality on the graphene layer 30 between the electrodes 50s, 50d. In these cases, the materials of the contact layers may be the same or different in kind.

In a case where the electronic device using graphene according to the present embodiment is used as an electromagnetic wave detector, the film thickness of the contact layer 60 should be thin enough so that the photoelectric conversion can be performed to the electromagnetic waves radiated on the graphene layer and, at the same time, however, thick enough so that the carrier doping can be performed from the contact layer 60 to the graphene layer 30. Further, it is necessary that the carriers such as molecules or electrons are introduced into the graphene. Therefore, for example, it is also possible to dope the carriers into the graphene layer 30 by immersing the graphene in a solution and supplying the carriers to the graphene at the molecular level without forming the contact layer 60.

As the contact layer 60, materials, except for the above-mentioned materials, that cause polarity conversion may be used. In that case, when the contact layer 60 undergoes polarity conversion, electrons or holes generated during the conversion are supplied to the graphene layer. As a result, electron doping or hole doping occurs in the graphene layer with which the contact layer 60 is in contact. Therefore, even if the contact layer 60 is removed, the graphene layer, which is in contact with the contact layer 60, remains in a state in which electrons or holes are doped. Therefore, in a case where a material that causes polarity conversion is used as the contact layer 60, the contact layer 60 can be removed. When the electronic device using graphene according to the present embodiment is used as the electromagnetic wave detector, the opening area of the graphene layer is increased and thus the detection sensitivity of the electromagnetic wave detector can be improved. Here, the polarity conversion is a phenomenon in which the polar group is chemically converted. For example, it means that an electron withdrawing group changes to an electron donating group, an electron donating group changes to an electron withdrawing group, a polar group changes to a non-polar group, or a non-polar group changes to a polar group.

Also, in a case where the contact layer 60 is to be formed of a material that causes polarity conversion by electromagnetic wave radiation, if a material that causes polarity conversion at a specific electromagnetic wave's wavelength is selected, the polarity conversion is performed and the photocurrent can be increased, only during the electromagnetic wave radiation at the specific electromagnetic wave's wavelength.

Further, a material that causes an oxidation-reduction reaction by electromagnetic wave radiation may be used as the contact layer 60. In that case, electrons or holes generated during the oxidation-reduction reaction can be doped into the graphene layer 30.

Note here that the structure of the electronic device using graphene according to the present embodiment can also be applied to other embodiments.

Embodiment 5

An electronic device using graphene according to Embodiment 5 of the present disclosure is different from Embodiment 4 in that the contact layer provided on the graphene layer is located near either the source region or the drain region. Since other parts with the same symbols are formed and structured in the same manner as in the electronic devices using graphene according to other embodiments, the description is omitted.

Figure 6:
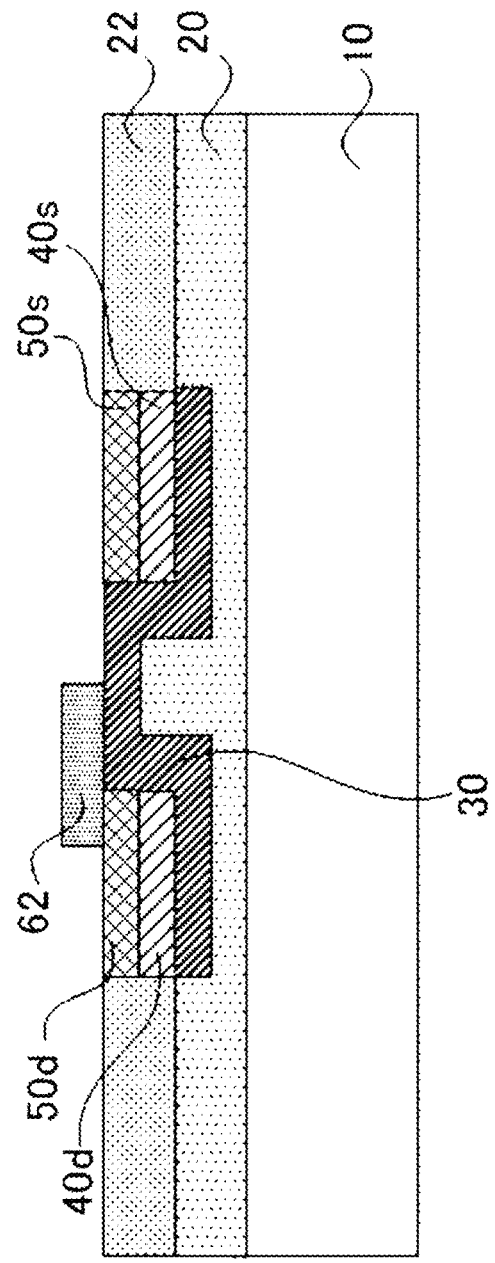
FIG. 6 is a cross section showing the structure of an electronic device using graphene according to Embodiment 5 of the present disclosure.

FIG. 6 is a cross section showing the structure of the electronic device using graphene according to the present embodiment, which is along the section line A-A in FIG. 1, as in the case of Embodiment 1.

As shown in FIG. 6, in the electronic device using graphene according to the present embodiment, a contact layer 62 provided on the graphene layer 30 is placed closer to either the electrode 50s or 50d provided in the source region or the drain region. That is, in the plan view, the contact layer 62 is located at an asymmetric position between the electrodes 50s, 50d.

Here, being located at an asymmetric position means that the contact layer 62 is asymmetrically positioned or the shape of the contact layer 62 is asymmetric with respect to the middle line between the electrodes 50s, 50d set as the axis of symmetry in the plan view. In other words, except for not symmetrizing the contact layer 62 by placing it near, for example, the electrode 50d as described above, the contact layer 62 having a shape asymmetric with respect to the axis of symmetry in the plan view may be placed on the axis of symmetry. Alternatively, both the arrangement and the shape of the contact layer 62 may be asymmetric.

Here, the material of the contact layer 62 is the same as that in Embodiment 4, and the effects accompanying the material of the contact layer 62 is also the same as those in Embodiment 4.

Next, the manufacturing method for the electronic device using graphene according to the present embodiment will be described.

In the production of the electronic device using graphene according to the present embodiment, the same steps as the steps from FIG. 2(*a*) to (*f*) shown in Embodiment 1 are used. After FIG. 2(*f*), the contact layer 62 is formed on the graphene layer 30 as shown in FIG. 6. The specific method of forming the contact layer 62 is the same as in Embodiment 4. At this time, if a tetramethylammonium hydroxide solution for a developing solution is used, the region of the graphene layer 30 where the contact layer 62 is not formed is doped in n-type. That is, the p-type graphene region and the n-type graphene region can be obtained by only developing the resist mask. With this structure, the mask forming process is not required, so that process damage can be reduced, and the process can be simplified.

Figure 7:
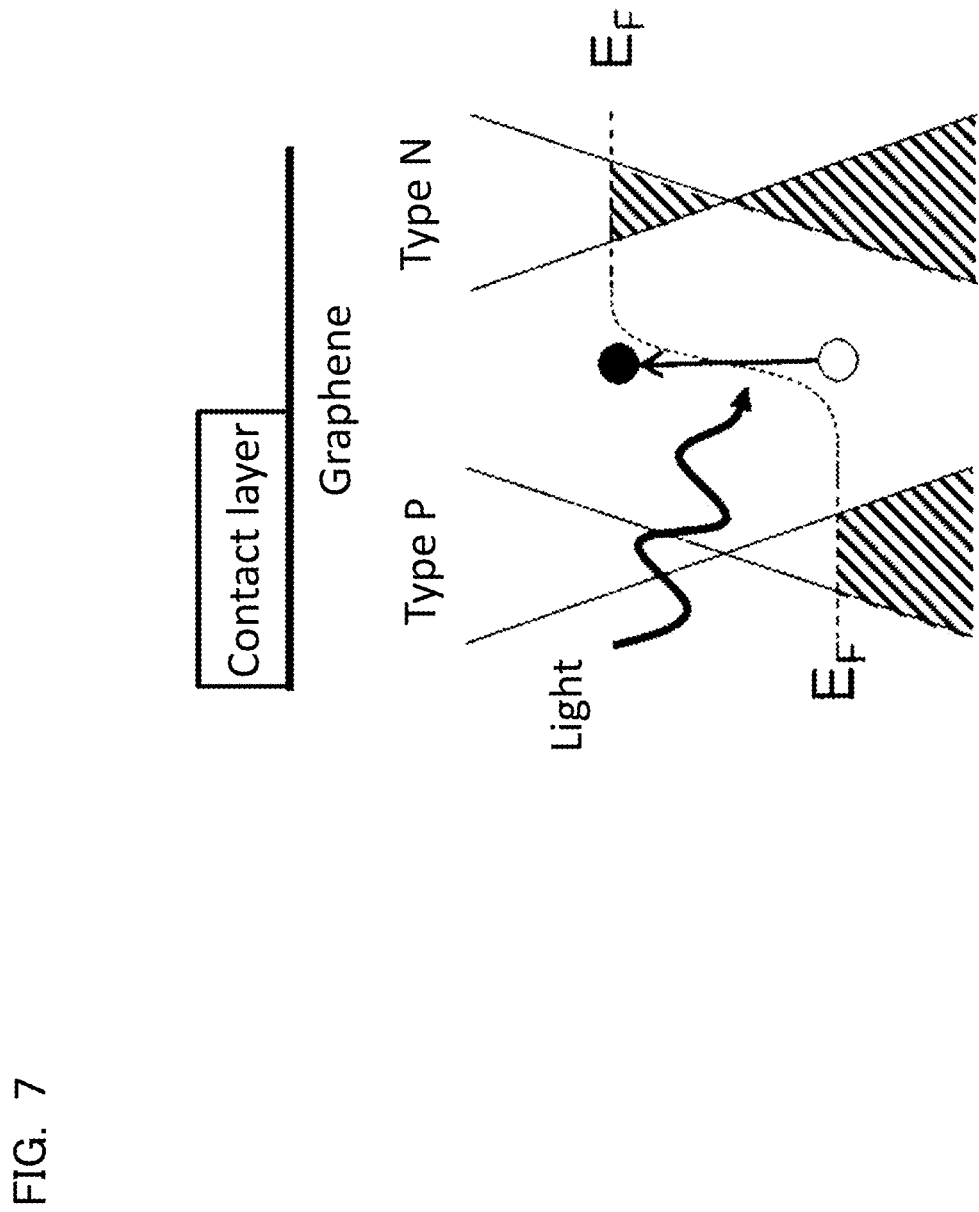
FIG. 7 is a diagram for explaining the effects of the electronic device using graphene according to Embodiment 5 of the present disclosure.

Next, effects of the electronic device using graphene and its manufacturing method according to the present embodiment will be described. FIG. 7 is a diagram for explaining the effects of the electronic device using graphene according to the present embodiment.

In the electronic device using graphene according to the present embodiment, after the graphene layer 30 is formed, it does not suffer the process damages due to the previously-mentioned processing steps performed when forming the channel region: etching, forming the resist mask when forming the electrodes, and forming the metal film Therefore, the electronic device using graphene according to the present embodiment can improve the performance. The details are the same as Embodiment 1 and are omitted here. Further, the electronic device using graphene according to the present embodiment can be produced without using the conventional transfer process in water as in Embodiment 1, and thus the mass productivity can be improved. In addition, in the electronic device using graphene according to the present embodiment, as in Embodiment 1, the graphene layers 30 is selectively grown from the catalytic metals 40*s*, 40*d*, and thus the graphene layer 30 is provided on the entire bottom surfaces of the catalytic metals 40*s*, 40*d*. As a result, the contact resistance between the graphene layer 30 and the catalytic metals 40*s*, 40*d* can be suppressed, and thus the performance of the electronic device using graphene can be improved.

Further, in the electronic device using graphene according to the present embodiment, as in Embodiment 4, the carrier doping of the graphene layer 30 can be controlled by the contact layer 62, so that the performance of the electronic device using graphene can be improved.

Furthermore, in the electronic device using graphene according to the present embodiment, as shown in FIG. 7, by providing the contact layer 62 on the graphene layer 30, a charge density gradient is generated between the portion in contact with the contact layer 62 and the portion in non-contact with the contact layer 62 in the graphene layer 30. That is, as shown in FIG. 7, a pseudo charge density gradient in terms of p-type and n-type is generated in the graphene layer 30 in the portion corresponding to the channel region. In a case where the electronic device using graphene according to the present embodiment is used as an electromagnetic wave detector, this charge density gradient generated in the graphene layer 30 in the portion corresponding to the channel region improves the extraction efficiency of the detection current generated by the electromagnetic wave irradiation in the graphene layer 30. As a result, the detection sensitivity of the electromagnetic wave detector with the electronic device using graphene according to the present embodiment can be increased. Here, the structure in which the contact layer 62 is asymmetrically placed between the electrodes 50*s*, 50*d* is exemplified. However, what is necessary is that the contact layer 62 generates a charge density gradient in the graphene layer 30, and thus the specific structural arrangement is not limited to the example of the present embodiment.

Note here that the structure of the electronic device using graphene according to the present embodiment can also be applied to other embodiments.

Embodiment 6

An electronic device using graphene according to Embodiment 6 of the present disclosure is different from Embodiment 4 and Embodiment 5 in that a contact layer is provided under the graphene layer corresponding to the channel region. Since other parts with the same symbols are formed and structured in the same manner as in the electronic devices using graphene according to other embodiments, the description is omitted.

Figure 8:
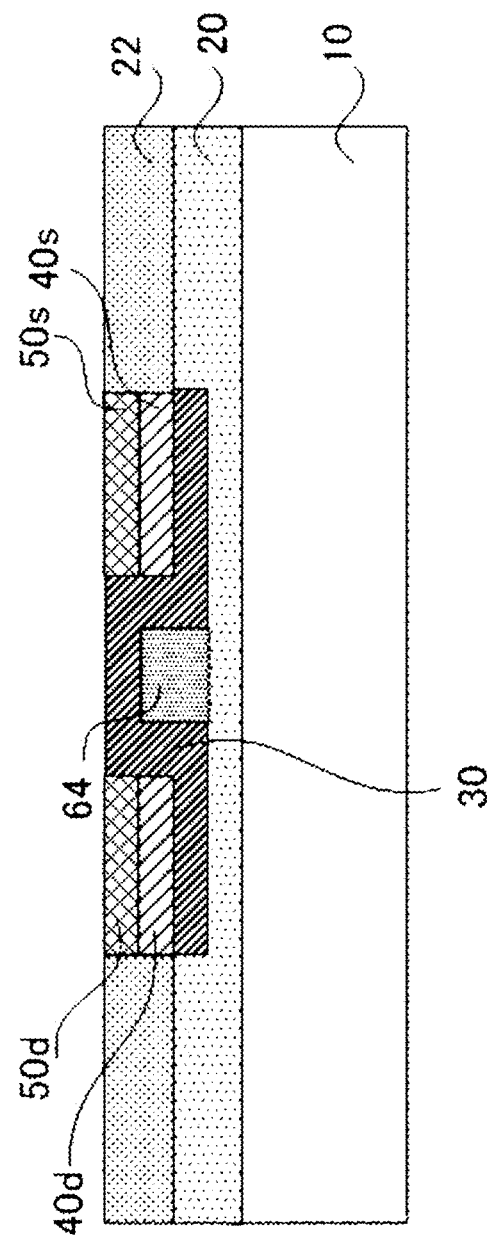
FIG. 8 is a cross section showing the structure of an electronic device using graphene according to Embodiment 6 of the present disclosure.

FIG. 8 is a cross section showing the structure of the electronic device using graphene according to the present embodiment, which is along the section line A-A in FIG. 1, as in the case of Embodiment 1.

As shown in FIG. 8, in the electronic device using graphene according to the present embodiment, the contact layer 64 is provided under the graphene layer 30 corresponding to the channel region, that is, between the graphene layer 30 corresponding to the channel region and the insulation film 20.

Here, the material of the contact layer 64 is the same as that in Embodiment 4, and the effects provided by the material of the contact layer 64 is also the same as those in Embodiment 4.

Figure 9:
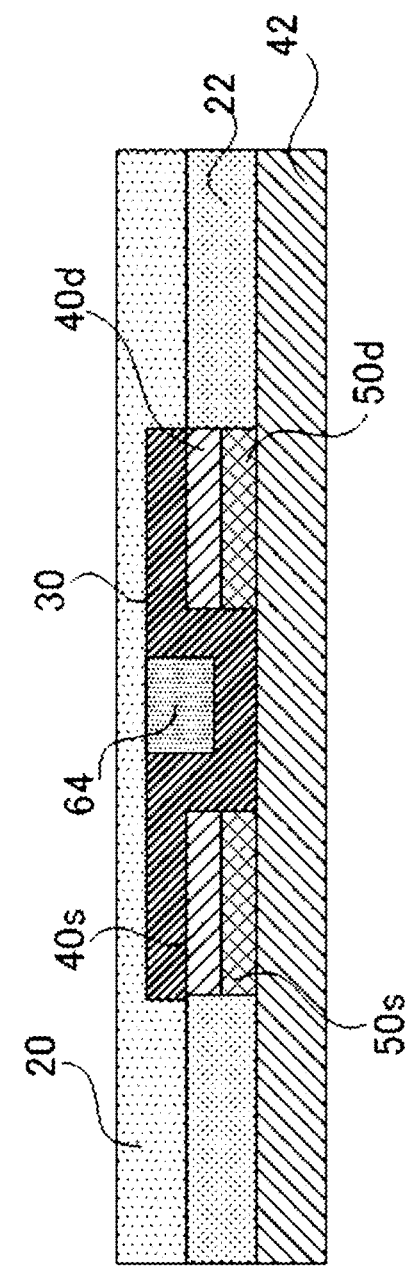
FIG. 9 is a cross section showing a part of the manufacturing method for the electronic device using graphene according to Embodiment 6 of the present disclosure.

Next, the manufacturing method for the electronic device using graphene according to the present embodiment will be described. FIG. 9 is a cross section showing a part of the manufacturing method for the electronic device using graphene according to the present embodiment. The description of the same production steps as in Embodiment 1 is omitted, and only the production step of FIG. 9 replacing FIG. 2(*d*) in Embodiment 1 will be described.

In the manufacturing method for the electronic device using graphene according to the present embodiment, after going through the production steps of FIG. 2(*a*) to (*c*), the contact layer 64 is formed, as shown in FIG. 9, in the recess of the graphene layer 30 corresponding to the channel region. Then, the insulation film 20 is formed so as to cover the passivation film 22, the graphene layer 30, and the contact layer 64. The following steps are the same as those in FIGS. 2(*e*) and (*f*). The specific method of forming the contact layer 64 is the same as in Embodiment 4.

Next, effects of the electronic device using graphene and its manufacturing method according to the present embodiment will be described.

In the electronic device using graphene according to the present embodiment, after the graphene layer 30 is formed, it does not suffer the process damages due to the previously-mentioned processing steps performed when forming the channel region: etching, forming the resist mask when forming the electrodes, and forming the metal film. Therefore, the electronic device using graphene according to the present embodiment can improve the performance. The details are the same as Embodiment 1 and are omitted here. Further, the electronic device using graphene according to the present embodiment can be produced without using the conventional transfer process in water as in Embodiment 1, and thus the mass productivity can be improved. In addition, in the electronic device using graphene according to the present embodiment, as in Embodiment 1, the graphene layers 30 is selectively grown from the catalytic metals 40s, 40d, and thus the graphene layer 30 is provided on the entire bottom surfaces of the catalytic metals 40s, 40d. As a result, the contact resistance between the graphene layer 30 and the catalytic metals 40s, 40d can be suppressed, and thus the performance of the electronic device using graphene can be improved. Further, in the electronic device using graphene according to the present embodiment, as in Embodiment 4, the carrier doping of the graphene layer 30 can be controlled by the contact layer 64, so that the performance of the electronic device using graphene can be improved.

Furthermore, in the electronic device using graphene according to the present embodiment, the contact layer 64 is provided under the graphene layer 30 corresponding to the channel region. Therefore, as compared with Embodiment 4 and Embodiment 5, the contact layer 64 does not attenuate or shield the radiated electromagnetic waves, and the graphene layer is directly irradiated by the electromagnetic waves. As a result, it is possible to improve the detection sensitivity of the electromagnetic wave detector with the electronic device using graphene according to the present embodiment.

Note here that the structure of the electronic device using graphene according to the present embodiment can also be applied to other embodiments.

Embodiment 7

An electronic device using graphene according to Embodiment 7 of the present disclosure is different from other embodiments in that at least one floating electrode is provided on the graphene layer. Since other parts with the same symbols are formed and structured in the same manner as in the electronic devices using graphene according to other embodiments, the description is omitted.

Figure 10:
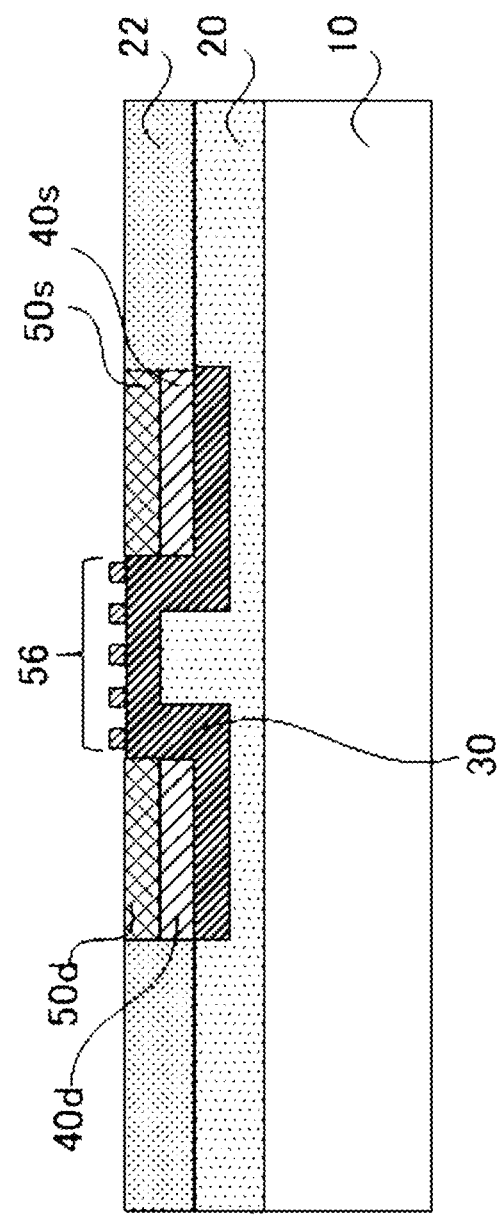
FIG. 10 is a cross section showing the structure of an electronic device using graphene according to Embodiment 7 of the present disclosure.

FIG. 10 is a cross section showing the structure of the electronic device using graphene according to the present embodiment, which is along the section line A-A in FIG. 1, as in the case of Embodiment 1.

As shown in FIG. 10, in the electronic device using graphene according to the present embodiment, the at least one floating electrode 56 is provided on the graphene layer 30 corresponding to the channel region. For the floating electrodes 56, a metal material such as Au, Ag, Cu, Al, Ni, Cr, or Pd can be used. The electrodes 56 are not connected to a power supply circuit or the like, thereby, to be floating.

The electrodes 56 are provided on the graphene layer 30 between the electrodes 50s, 50d in a one-dimensional or two-dimensional periodic structure. Specifically, in a case of a one-dimensional periodic structure, for example, a plurality of the electrodes 56 are periodically arranged in the horizontal direction or the depth direction on the paper plane of FIG. 10. In a case of a two-dimensional periodic structure, for example, a plurality of the electrodes 56 are periodically arranged in a square lattice or a triangular lattice in the plan view. The shape of each of the electrodes 56 may be a circle, a triangle, a quadrangle, a polygon, an ellipse, or the like in the plan view. The arrangement of the electrodes 56 is not limited to be symmetric and the periodic arrangement described above and the shapes of the electrodes 56 may be asymmetric in the plan view.

Next, the manufacturing method for the electronic device using graphene according to the present embodiment will be described with reference to FIG. 10. In the production of the electronic device using graphene according to the present embodiment, the same steps as the steps from FIG. 2(*a*) to (*f*) shown in Embodiment 1 are used. After FIG. 2(*f*), the electrodes 56 are formed on the graphene layer 30 as shown in FIG. 10. The specific method of forming the electrodes 56 is the same as the method of, for example, forming the electrodes 50s, 50d described in Embodiment 1.

Next, effects of the electronic device using graphene and its manufacturing method according to the present embodiment will be described.

In the electronic device using graphene according to the present embodiment, after the graphene layer 30 is formed, it does not suffer the process damages due to the previously-mentioned processing steps performed when forming the channel region: etching, forming the resist mask when forming the electrodes, and forming the metal film Therefore, the electronic device using graphene according to the present embodiment can improve the performance. The details are the same as Embodiment 1 and are omitted here. Further, the electronic device using graphene according to the present embodiment can be produced without using the conventional transfer process in water as in Embodiment 1, and thus the mass productivity can be improved. In addition, in the electronic device using graphene according to the present embodiment, as in Embodiment 1, the graphene layers 30 is selectively grown from the catalytic metals 40s, 40d, and thus the graphene layer 30 is provided on the entire bottom surfaces of the catalytic metals 40s, 40d. As a result, the contact resistance between the graphene layer 30 and the catalytic metals 40s, 40d can be suppressed, and thus the performance of the electronic device using graphene can be improved.

Further, in the electronic device using graphene according to the present embodiment, the floating electrodes 56 are provided on the graphene layer 30 corresponding to the channel region. As a result, the light carriers generated by the radiation of the electromagnetic waves can travel back and forth between the plurality of the electrodes 56, and thus the life of the light carriers is extended. Therefore, in a case where the electronic device using graphene according to the present embodiment is used in an electromagnetic wave detector, the sensitivity of the electromagnetic wave detector can be increased.

Furthermore, the plurality of electrodes 56 are made to have a one dimensional periodic structure, and the material of the electrodes 56 is made to be a material generating surface plasmon resonance, whereby polarization dependence is generated in the electrodes 56 with respect to incident electromagnetic waves. As a result, only the electromagnetic waves having a specific polarization can be detected by the electronic device using graphene. Therefore, the electromagnetic wave detector with the electronic device using graphene according to the present embodiment can detect only a specific polarized light.

Furthermore, if the arrangement of the plurality of the electrodes 56 is two-dimensionally periodic and the material is one causing surface plasmon resonance, the electromagnetic waves having a specific wavelength can be resonated. As a result, only the electromagnetic waves having the specific wavelength can be detected by the electronic device using graphene. Therefore, the electromagnetic wave detector with the electronic device using graphene according to the present embodiment can detect only electromagnetic waves having the specific wavelength with high sensitivity.

Furthermore, if the arrangement of the plurality of the electrodes 56 is made asymmetric, polarization dependence is generated in the electrodes 56 with respect to incident electromagnetic waves, as with the case of the one-dimensionally periodic arrangement. As a result, only the electromagnetic waves having a specific polarization can be radiated to the electronic device using graphene. Therefore, the electromagnetic wave detector with the electronic device using graphene according to the present embodiment can detect only the specific polarized light.

Note here that the structure of the electronic device using graphene according to the present embodiment can also be applied to other embodiments.

Embodiment 8

The electronic device using graphene according to Embodiment 8 of the present disclosure is different from Embodiment 7 in that at least one floating electrode is embedded in the graphene layer. Since other parts with the same symbols are formed and structured in the same manner as in the electronic devices using graphene according to other embodiments, the description is omitted.

Figure 11:
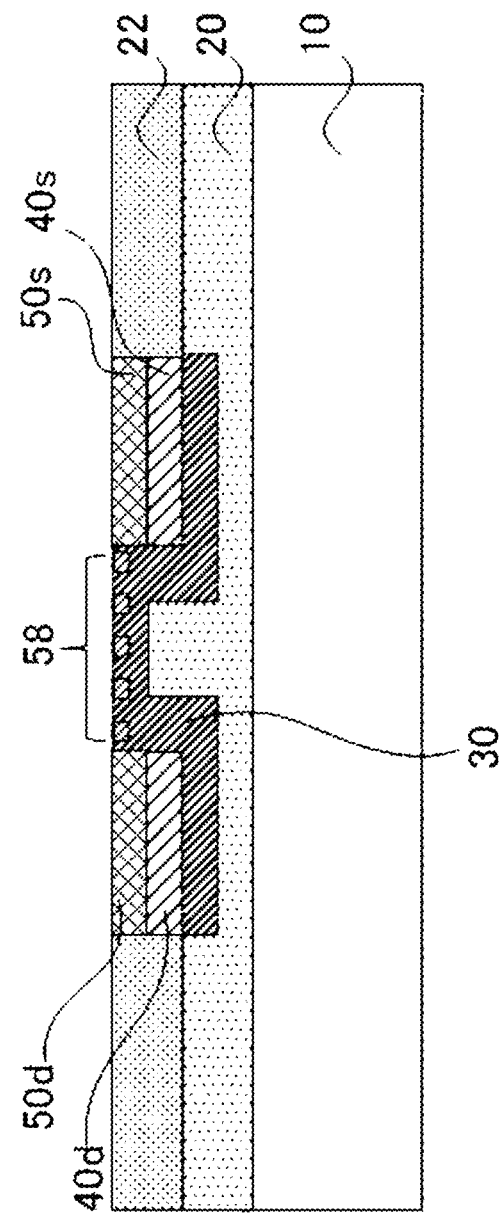
FIG. 11 is a cross section showing the structure of an electronic device using graphene according to Embodiment 8 of the present disclosure.

FIG. 11 is a cross section showing the structure of the electronic device using graphene according to the present embodiment, which is along the section line A-A in FIG. 1, as in the case of Embodiment 1.

As shown in FIG. 11, the at least one floating electrode 58 is embedded in the graphene layer 30. The material of the electrodes 58 and the method of the arrangement are the same as those of the electrodes 56 in Embodiment 7, and thus the description thereof is omitted.

Figure 12:
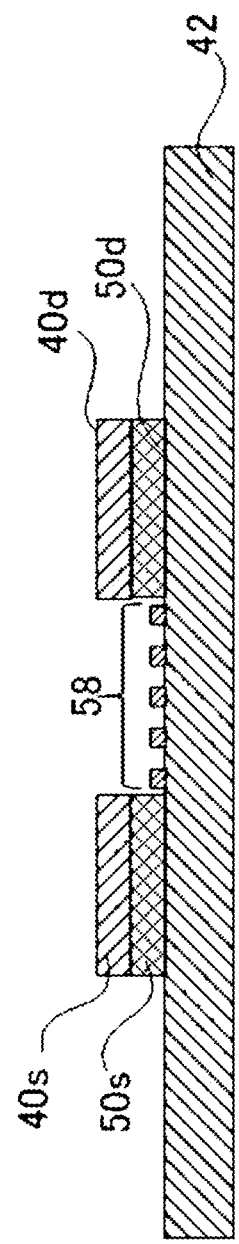
FIG. 12 is a cross section showing a part of the manufacturing method for the electronic device using graphene according to Embodiment 8 of the present disclosure.

Next, the manufacturing method for the electronic device using graphene according to the present embodiment will be described. FIG. 12 is a cross section showing a part of the manufacturing method for the electronic device using graphene according to the present embodiment. The description of the same production steps as in Embodiment 1 is omitted, and only the production step of FIG. 12, which is different from and replacing FIG. 2(a) of Embodiment 1, will be described.

As shown in FIG. 12, first, the electrodes 50s, 50d and the catalytic metals 40s, 40d are formed on the catalytic metal 42 as in the case of Embodiment 1. After that, a resist mask having openings corresponding to the electrodes 58 is formed on the catalytic metal 42 by using, for example, photolithography or EB lithography. Then, the metal layers of the electrodes 58 are deposited by using EB evaporation or a sputter deposition method, and then the metal films formed except for in the openings are lifted off together with the resist mask, so that the electrodes 58 as shown in FIG. 12 are formed. The following steps are the same as those in Embodiment 1.

Here, as a method of forming the electrodes 58, the method in which the electrodes 50s, 50d and the catalytic metals 40s, 40d are formed first, and then the electrodes 58 are formed in another step is exemplified. However, the above is not a limitation. Alternatively, for example, when forming the electrodes 50s, 50d and the catalytic metals 40s, 40d, the electrodes 58 may be formed simultaneously.

Next, effects of the electronic device using graphene and its manufacturing method according to the present embodiment will be described.

In the electronic device using graphene according to the present embodiment, after the graphene layer 30 is formed, it does not suffer the process damages due to the previously-mentioned processing steps performed when forming the channel region: etching, forming the resist mask when forming the electrodes, and forming the metal film. Therefore, the electronic device using graphene according to the present embodiment can improve the performance. The details are the same as Embodiment 1 and are omitted here. Further, the electronic device using graphene according to the present embodiment can be produced without using the conventional transfer process in water as in Embodiment 1, and thus the mass productivity can be improved. Furthermore, in the electronic device using graphene according to the present embodiment, as in Embodiment 1, the graphene layers 30 is selectively grown from the catalytic metals 40s, 40d, and thus the graphene layer 30 is provided on the entire bottom surfaces of the catalytic metals 40s, 40d. As a result, the contact resistance between the graphene layer 30 and the catalytic metals 40s, 40d can be suppressed, and thus the performance of the electronic device using graphene can be improved. Moreover, since the life of the light carriers can be extended similarly to Embodiment 7, in a case where the electronic device using graphene according to the present embodiment is used in an electromagnetic wave detector, the sensitivity of the electromagnetic wave detector can be increased. In addition, if the arrangement of the plurality of the electrodes 58 is one-dimensionally periodic and the material is one causing surface plasmon resonance, only a specific polarized light can be detected as in Embodiment 7. Further, if the arrangement of the plurality of the electrodes 58 is two-dimensionally periodic and the material is one causing surface plasmon resonance, only electromagnetic waves having a specific wavelength can be detected with high sensitivity as in Embodiment 7. Furthermore, if the arrangement of the plurality of the electrodes 58 is made asymmetric, only a specific polarized light can be detected as in the case where the arrangement of the plurality of the electrodes 58 is one-dimensionally periodic.

Here, alternatively, after forming the electrodes 58, recesses and projections may be formed on the graphene layer 30 corresponding to the channel region by removing the electrodes 58 embedded in the graphene layer 30. In that case, if the arrangement of the recesses and projections formed on the graphene layer 30 is made periodic or asymmetric as those described in Embodiment 7, the same effects as those described in Embodiment 7 will be obtained.

Note here that the structure of the electronic device using graphene according to the present embodiment can also be applied to other embodiments.

Embodiment 9

An electronic device using graphene according to Embodiment 9 of the present disclosure is different from other embodiments in that a space is provided under the graphene layer in the portion corresponding to the channel region. Since other parts with the same symbols are formed and structured in the same manner as in the electronic devices using graphene according to other embodiments, the description is omitted.

Figure 13:
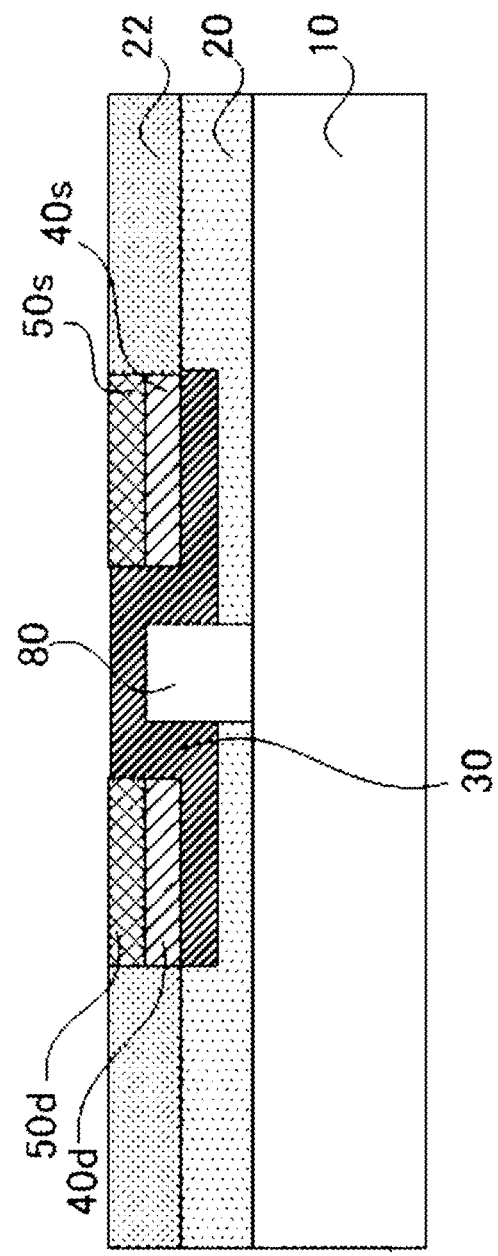
FIG. 13 is a cross section showing the structure of an electronic device using graphene according to Embodiment 9 of the present disclosure.

FIG. 13 is a cross section showing the structure of the electronic device using graphene according to the present embodiment, which is along the section line A-A in FIG. 1, as in the case of Embodiment 1.

As shown in FIG. 13, in the electronic device using graphene according to the present embodiment, a space 80 is provided under the graphene layer 30 in the portion corresponding to the channel region. That is, unlike Embodiment 1, the graphene layer 30 is not in contact with the insulation film 20 in the portion corresponding to the channel region.

Figure 14:
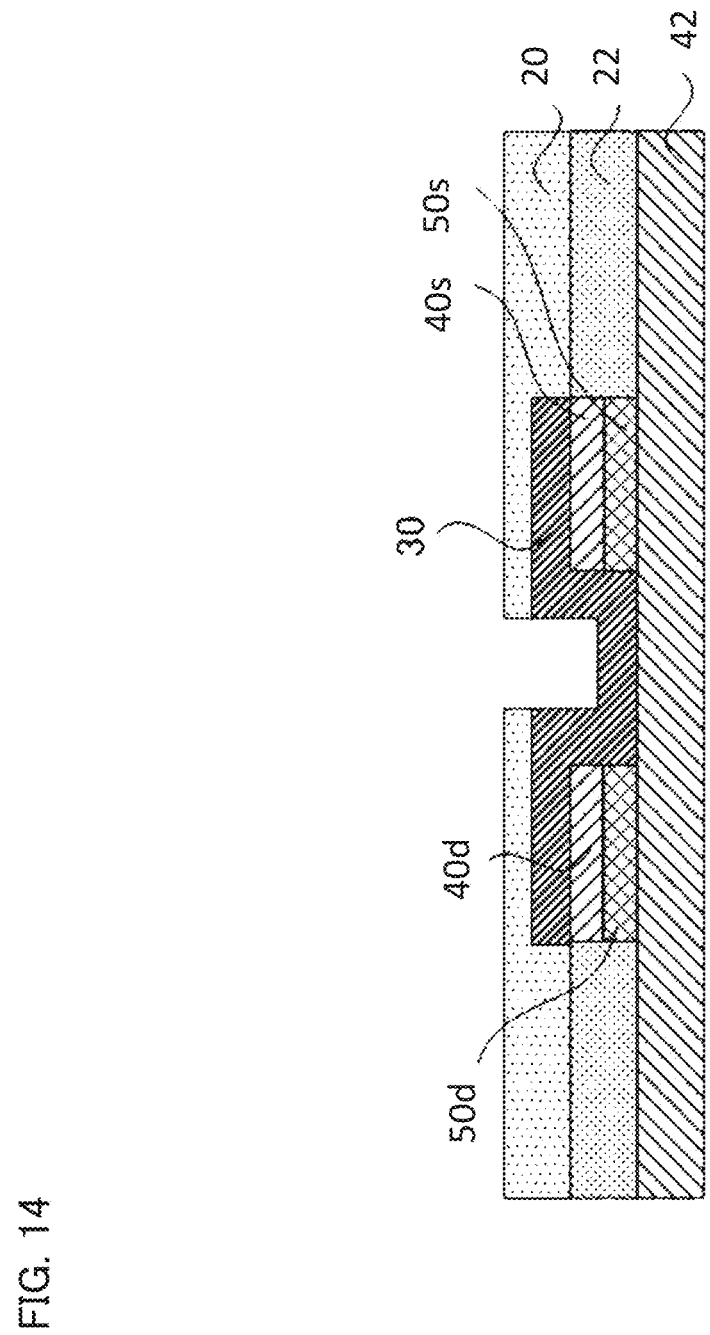
FIG. 14 is a cross section showing a part of the manufacturing method for the electronic device using graphene according to Embodiment 9 of the present disclosure.

Next, the manufacturing method for the electronic device using graphene according to the present embodiment will be described. FIG. 14 is a cross section showing a part of the manufacturing method for the electronic device using graphene according to the present embodiment. The description of the same production steps as in Embodiment 1 is omitted, and only the production step of FIG. 14, which is different from and replaces FIG. 2(*d*) of Embodiment 1, will be described.

After the steps of FIG. 2(*a*) to (*c*), as shown in FIG. 14, the insulation film 20 is formed on the graphene layer 30 and the passivation film 22 as in Embodiment 1.

Then, the insulation film 20 in the portion corresponding to the channel region is removed by etching or the like. The next steps, FIGS. 2(*e*) and (*f*), are the same as those of Embodiment 1. In the step of FIG. 2(*e*), the substrate 10 is attached to the insulation film 20. However, since the insulation film 20 on the graphene layer 30 in the portion corresponding to the channel region is removed in the step of FIG. 14, the graphene layer 30 in the portion corresponding to the channel region is not in contact with the insulation film 20 and the substrate 10.

Next, effects of the electronic device using graphene and its manufacturing method according to the present embodiment will be described.

In the electronic device using graphene according to the present embodiment, after the graphene layer 30 is formed, it does not suffer the process damages due to the previously-mentioned processing steps performed when forming the channel region: etching, forming the resist mask when forming the electrodes, and forming the metal film Therefore, the electronic device using graphene according to the present embodiment can improve the performance. The details are the same as Embodiment 1 and are omitted here. Further, the electronic device using graphene according to the present embodiment can be produced without using the conventional transfer process in water as in Embodiment 1, and thus the mass productivity can be improved. In addition, in the electronic device using graphene according to the present embodiment, as in Embodiment 1, the graphene layers 30 is selectively grown from the catalytic metals 40*s*, 40*d*, and thus the graphene layer 30 is provided on the entire bottom surfaces of the catalytic metals 40*s*, 40*d*. As a result, the contact resistance between the graphene layer 30 and the catalytic metals 40*s*, 40*d* can be suppressed, and thus the performance of the electronic device using graphene can be improved.

Furthermore, the electronic device using graphene according to the present embodiment has the space 80 under the graphene layer 30 in the portion corresponding to the channel region. As a result, the influence of carrier scattering due to the contact between the insulation film 20 and the graphene layer 30 can be eliminated, and thereby the carrier mobility reduction can be suppressed.

As a result, the performance of the electronic device using graphene according to the present embodiment can be improved. Moreover, since the performance of the electronic device using graphene can be improved, the sensitivity of the electromagnetic wave detector with the electronic device using graphene according to the present embodiment can be increased.

In the electronic device using graphene according to the present embodiment, the space 80 is formed only under the graphene layer 30 in the portion corresponding to the channel region. However, alternatively, the space may be formed under the graphene layer 30 in contact with the electrodes 50*s*, 50*d*.

Note here that the structure of the electronic device using graphene according to the present embodiment can also be applied to other embodiments.

Embodiment 10

An electronic device using graphene according to Embodiment 10 of the present disclosure is different from other embodiments in that the graphene layer corresponding to the channel region is in contact with a substrate. Since other parts with the same symbols are formed and structured in the same manner as in the electronic devices using graphene according to other embodiments, the description is omitted.

Figure 15:
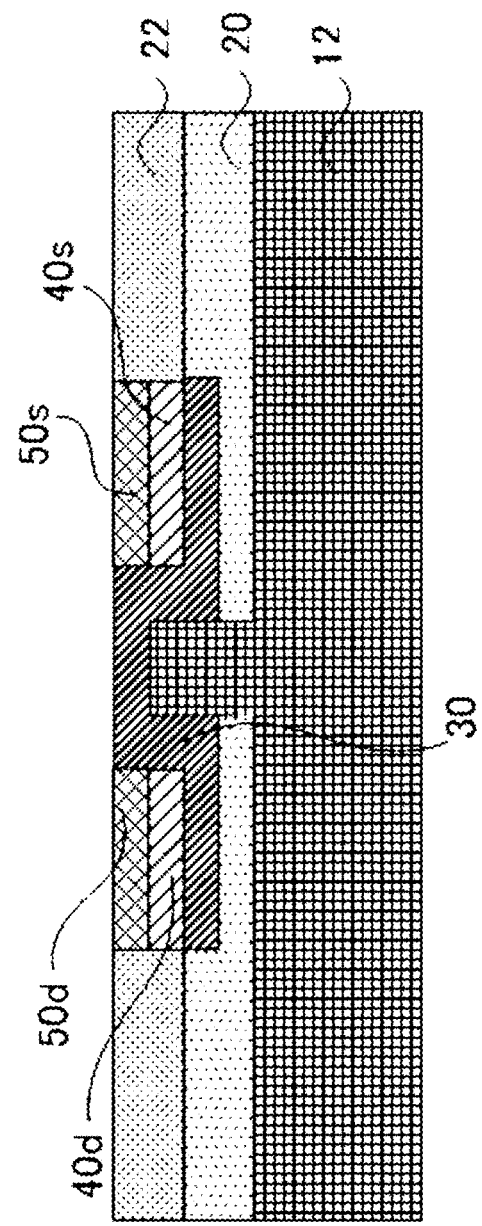
FIG. 15 is a cross section showing the structure of an electronic device using graphene according to Embodiment 10 of the present disclosure.

FIG. 15 is a cross section showing the structure of the electronic device using graphene according to the present embodiment, which is along the section line A-A in FIG. 1, as in the case of Embodiment 1.

As shown in FIG. 15, in the electronic device using graphene according to the present embodiment, the graphene layer 30 corresponding to the channel region is in contact with a substrate 12. As the material of the substrate 12, the same material as that of the substrate 10 described in Embodiment 1 can be used. As the material of the substrate 12, a semiconductor material such as silicon including, specifically, a high-resistance silicon substrate and a highly-insulating substrate with a thermal oxide film; an impurity-doped silicon substrate; and a compound semiconductor such as a germanium-based semiconductor, III-V or II-V semiconductor are preferable.

Next, the manufacturing method for the electronic device using graphene according to the present embodiment will be described. In the manufacturing method, the description of the same steps as in Embodiment 1 and Embodiment 9 is omitted, and only the steps different from those in Embodiment 1 and Embodiment 9 will be described.

After the steps of FIG. 2(*a*) to (*c*) and the step of FIG. 14, the substrate 12 is deposited so that it will cover the upper surface of the insulation film 20 and be in contact with the graphene layer 30 exposed in the opening of the insulation film 20 by using, for example, a solution coating method. Alternatively, here, using a flat substrate as the substrate 12, the flat substrate 12 and the graphene layer 30 may be brought into contact with each other.

Next, effects of the electronic device using graphene and its manufacturing method according to the present embodiment will be described.

In the electronic device using graphene according to the present embodiment, after the graphene layer 30 is formed, it does not suffer the process damages due to the previously-mentioned processing steps performed when forming the channel region: etching, forming the resist mask when forming the electrodes, and forming the metal film Therefore, the electronic device using graphene according to the present embodiment can improve the performance. The details are the same as Embodiment 1 and are omitted here. Further, the electronic device using graphene according to the present embodiment can be produced without using the conventional transfer process in water as in Embodiment 1, and thus the mass productivity can be improved. In addition, in the electronic device using graphene according to the present embodiment, as in Embodiment 1, the graphene layers 30 is selectively grown from the catalytic metals 40s, 40d, and thus the graphene layer 30 is provided on the entire bottom surfaces of the catalytic metals 40s, 40d. As a result, the contact resistance between the graphene layer 30 and the catalytic metals 40s, 40d can be suppressed, and thus the performance of the electronic device using graphene can be improved.

Further, in the electronic device using graphene according to the present embodiment, the substrate 12 is provided so as to be in contact with the graphene layer 30 corresponding to the channel region, and also the back-gate voltage is applied to the substrate 12 as in Embodiment 1. Therefore, the substrate 12 and the electrodes 50s, 50d function as terminals. This causes the graphene layer 30 and the substrate 12 to form a Schottky structure. As a result, the performance of the electronic device using graphene according to the present embodiment can be improved.

In an electromagnetic wave detector with the electronic device using graphene according to the present embodiment, by selecting a material for the substrate 12 that absorbs the wavelength of the electromagnetic waves to be detected, the carriers generated in the substrate 12 can be directly injected into the graphene layer 30 by the formed graphene-substrate Schottky. As a result, the detection sensitivity of the electromagnetic wave detector can be increased. In the present embodiment, a structure having the source and drain electrodes is exemplified. However, the source and drain electrodes are not necessarily required, and alternatively a structure having only one of the source and the drain may be used. In this case, there is formed a two-terminal diode structure with a source or drain and a gate, in which the Schottky junction enables the OFF operation. Also, when used as the electromagnetic wave detector, the dark current decreases during the OFF operation, so that the noise is reduced.

Note here that the structure of the electronic device using graphene according to the present embodiment can also be applied to other embodiments.

Embodiment 11

An electronic device using graphene according to Embodiment 11 of the present disclosure is different from Embodiment 10 in that the graphene layer corresponding to the channel region further includes a region where the graphene layer and the substrate are in contact with each other and regions where the graphene layer and the insulation film are in contact with each other. Since other parts with the same symbols are formed and structured in the same manner as in the electronic devices using graphene according to other embodiments, the description is omitted.

Figure 16:
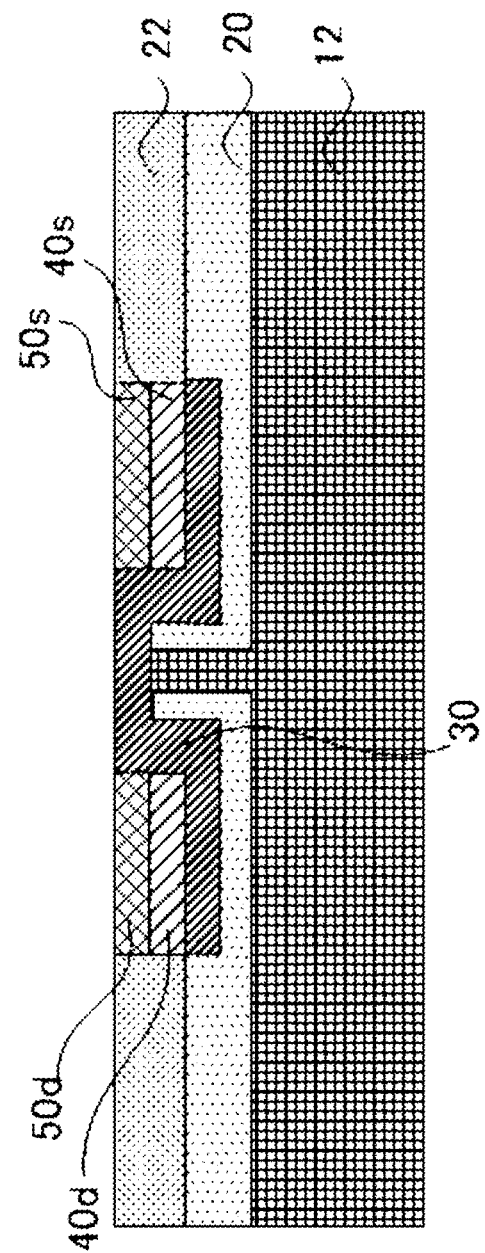
FIG. 16 is a cross section showing the structure of an electronic device using graphene according to Embodiment 11 of the present disclosure.

FIG. 16 is a cross section showing the structure of the electronic device using graphene according to the present embodiment, which is along the section line A-A in FIG. 1, as in the case of Embodiment 1.

As shown in FIG. 16, in the electronic device using graphene according to the present embodiment, the graphene layer 30 corresponding to the channel region between the source and drain electrodes 50s, 50d has a region in contact with the substrate 12 and regions in contact with the insulation film 20, and the insulation film 20 is provided also on the side surfaces of the graphene layer 30 corresponding to the source and drain regions. For example, if this structure is applied to Embodiment 2, the region in contact with the substrate 12 and the regions in contact with the insulating layer 20 will be provided in the single-layered graphene layer 32 corresponding to the channel region.

Figure 17:
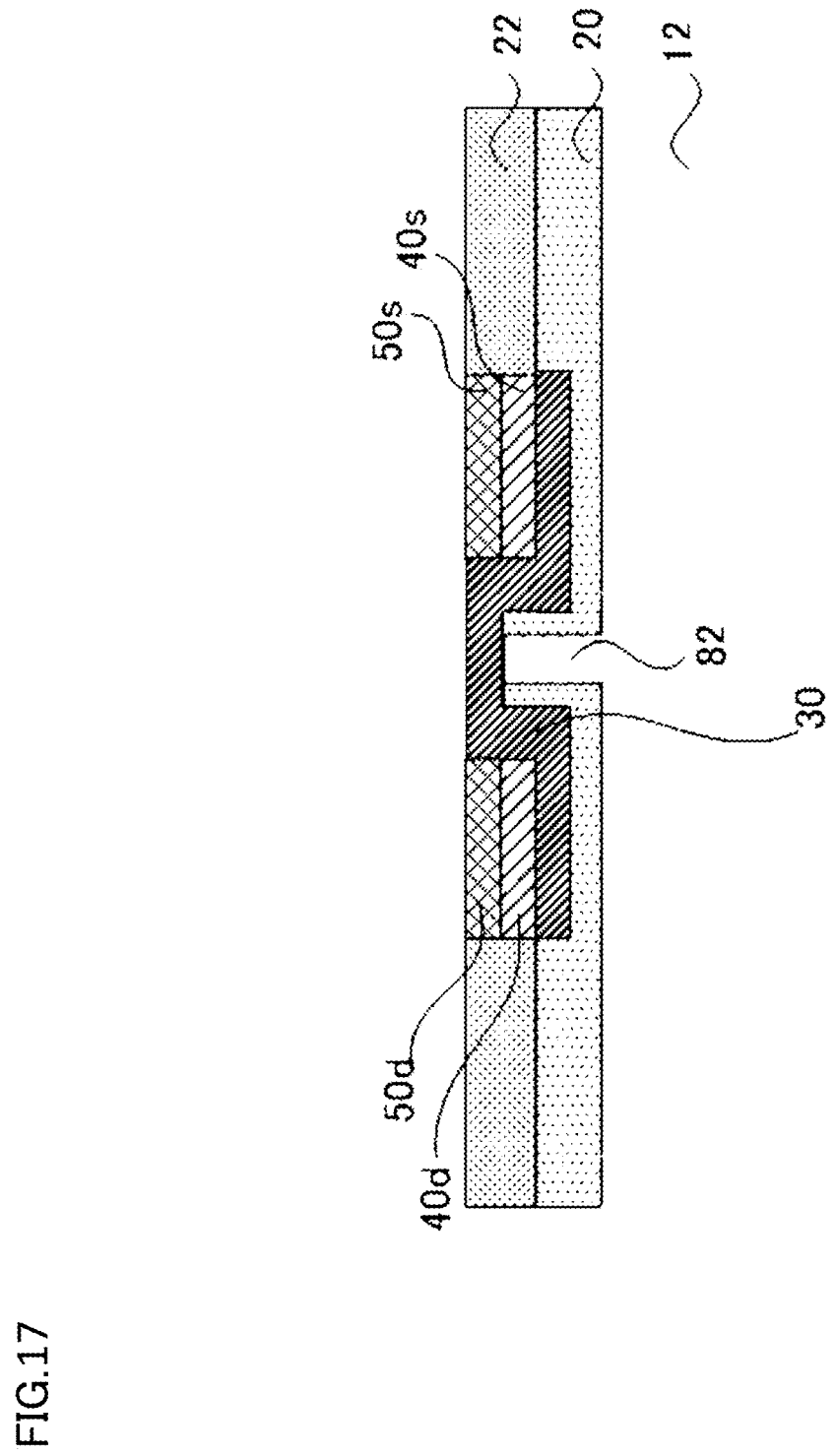
FIG. 17 is a cross section showing the manufacturing method for the electronic device using graphene according to Embodiment 11 of the present disclosure.

Next, the manufacturing method for the electronic device using graphene according to the present embodiment will be described. FIG. 17 is a cross section showing a part of the manufacturing method for the electronic device using graphene according to the present embodiment. The description of the same production steps as in Embodiment 1 is omitted, and only the production steps different from those in Embodiment 1 will be described.

After the steps of FIG. 2(a) to (c), as shown in FIG. 17, the insulation film 20 is formed on the graphene layer 30 and the passivation film 22 as in Embodiment 1.

Then, as shown in FIG. 17, a part of the insulation film 20 formed on the graphene layer 30 corresponding to the channel region is removed by etching or the like. At this time, the regions where the insulation film 20 is formed and the region where the opening 82 is formed by etching are provided on the graphene layer 30 corresponding to the channel region.

Then, in the step of FIG. 2(e), the substrate 12 is deposited by using, for example, a solution coating method on the insulation film 20 so as to be in contact with the graphene layer 30 exposed in the opening 82 of the insulation film 20. Alternatively, here, using a flat substrate as the substrate 12, the substrate 12 and the graphene layer 30 may be brought into contact with each other.

Next, effects of the electronic device using graphene and its manufacturing method according to the present embodiment will be described.

In the electronic device using graphene according to the present embodiment, after the graphene layer 30 is formed, it does not suffer the process damages due to the previously-mentioned processing steps performed when forming the channel region: etching, forming the resist mask when forming the electrodes, and forming the metal film Therefore, the electronic device using graphene according to the present embodiment can improve the performance. The details are the same as Embodiment 1 and are omitted here. Further, the electronic device using graphene according to the present embodiment can be produced without using the conventional transfer process in water as in Embodiment 1, and thus the mass productivity can be improved. In addition, in the electronic device using graphene according to the present embodiment, as in Embodiment 1, the graphene layers 30 is selectively grown from the catalytic metals 40s, 40d, and thus the graphene layer 30 is provided on the entire bottom surfaces of the catalytic metals 40s, 40d. As a result, the contact resistance between the graphene layer 30 and the catalytic metals 40s, 40d can be suppressed, and thus the performance of the electronic device using graphene can be improved.

Furthermore, in the electronic device using graphene according to the present embodiment, due to the structure of the substrate 12, the graphene layer 30 corresponding to the channel region and the substrate 12 are in contact with each other. Therefore, as in Embodiment 10, the Schottky structure of the graphene layer 30 and the substrate 12 is formed, and thus the performance of the electronic device using graphene according to the present embodiment can be improved.

Moreover, in an electromagnetic wave detector with the electronic device using graphene according to the present embodiment, by selecting a material that absorbs the wavelength of electromagnetic waves to be detected as the material of the substrate 12, the graphene-substrate Schottky allows the carriers generated in the substrate 12 to be directly injected into the graphene layer 30, and in addition, the effect of changing the gate voltage in the graphene layer 30, namely the photo gating effect to be described later, due to the change in the electric field generated in the substrate 12 through the insulation film 20 can be obtained. As a result, the carriers injected from the substrate 12 into the graphene layer 30 and the electric field change generated in the substrate 12 together change the conductivity of the graphene layer 30, so that the detection sensitivity of the electromagnetic wave detector can be further enhanced as compared with Embodiment 10. In the present embodiment, a structure having the source and drain electrodes is exemplified. However, the source and drain electrodes are not necessarily required in a pair, and alternatively a structure having only one of the source and the drain may be used.

In this case, there is formed a two-terminal diode structure with a source or drain and a gate, in which the Schottky junction enables the OFF operation. Also, when used as the electromagnetic wave detector, the dark current decreases during the OFF operation, so that the noise is reduced.

Note here that the structure of the electronic device using graphene according to the present embodiment can also be applied to other embodiments.

Embodiment 12

The electronic device using graphene according to Embodiment 12 of the present disclosure is different from other embodiments in that the graphene layer corresponding to the channel region is provided in a turbostratic structure. Since other parts with the same symbols are formed and structured in the same manner as in the electronic devices using graphene according to other embodiments, the description is omitted.

Figure 18:
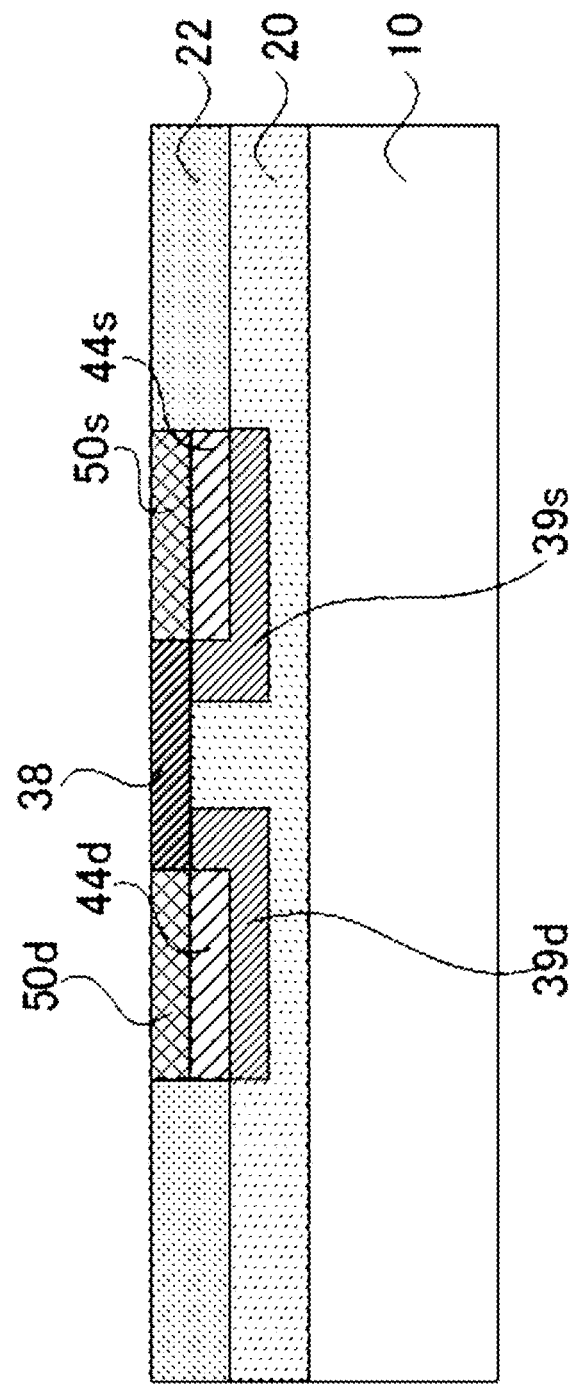
FIG. 18 is a cross section showing the structure of an electronic device using graphene according to Embodiment 12 of the present disclosure.

FIG. 18 is a cross section showing the structure of the electronic device using graphene according to the present embodiment, which is along the section line A-A in FIG. 1, as in the case of Embodiment 1.

In FIG. 18, the electronic device using graphene according to the present embodiment is provided with a graphene layer 38 corresponding to the channel region in a turbostratic structure. To be more specific, for the graphene layer 38 corresponding to the channel region, a graphene layer having a turbostratic structure in which a plurality of graphene layers is stacked, and the lattices of the graphene layers are arranged in a mismatched state is provided. For each of the graphene layers 39s, 39d corresponding to the source and drain regions, multi-layered graphene of an A-B stacking structure formed from a plurality of graphene layers in which the lattices of the graphene layers are matched or single-layered graphene is provided. For example, when applied to Embodiment 2, one or more graphene layers are provided on the single-layered graphene layer 32 so as to form a turbostratic structure together, and thus the graphene layer 38 of the turbostratic structure is formed.

Next, the manufacturing method for the electronic device using graphene according to the present embodiment will be described. The description of the same production steps as in Embodiment 1 is omitted, and only the production steps different from those in Embodiment 1 will be described.

After the steps of FIG. 2(a) to (f), a graphene layer produced by the CVD method is transferred multiple times to be stacked in the turbostratic structure on the graphene layer 30 exposed on the outermost surface. Then, by removing the graphene except for on the channel region, the graphene layer 38 of the turbostratic structure can be formed in the portion corresponding to the channel region.

Alternatively, after the steps of FIG. 2(a) to (c), graphene may be grown on the graphene layer 30 by the CVD method using ethanol or the like as a carbon source to form the graphene layer 38 of the turbostratic structure, or graphene may be transferred multiple times on the graphene layer 30 to form the same. In these cases, a mask may be used to form the graphene of the turbostratic structure selectively on the graphene layer 30 corresponding to the channel region, or the graphene may be formed on the entire surface of the graphene layer 30.

Next, effects of the electronic device using graphene and its manufacturing method according to the present embodiment will be described.

In the electronic device using graphene according to the present embodiment, after the graphene layer 30 is formed, it does not suffer the process damages due to the previously-mentioned processing steps performed when forming the channel region: etching, forming the resist mask when forming the electrodes, and forming the metal film Therefore, the electronic device using graphene according to the present embodiment can improve the performance. The details are the same as Embodiment 1 and are omitted here. Further, the electronic device using graphene according to the present embodiment can be produced without using the conventional transfer process in water as in Embodiment 1, and thus the mass productivity can be improved. In addition, in the electronic device using graphene according to the present embodiment, as in Embodiment 1, the graphene layer 30 is selectively grown from the catalytic metals 40s, 40d, and thus the graphene layer 30 is provided on the entire bottom surfaces of the catalytic metals 40s, 40d. As a result, the contact resistance between the graphene layer 30 and the catalytic metals 40s, 40d can be suppressed, and thus the performance of the electronic device using graphene can be improved.

In addition, the electronic device using graphene according to the present embodiment improves the mobility of graphene by using graphene of the turbostratic structure in the channel region. A normal stacking of graphene layers is called an A-B stacking, in which the graphene layers are stacked with their lattices matched with each other. However, the graphene produced by the CVD method is polycrystalline. Therefore, when such graphene is further transferred onto graphene multiple of times, or when such graphene is stacked on the underlying graphene serving as a nucleus by using the CVD method, the resultant graphene layers are stacked in a turbostratic structure with their graphene lattices unmatched with each other. The layered-graphene with the turbostratic structure is less affected by the interaction between the layers and thus has the same properties as single-layered graphene. Further, in general, graphene is affected by the carrier scattering of the underlying insulation film, and its mobility decreases. Therefore, in the graphene layers stacked in the turbostratic structure, the graphene layer in direct contact with the insulation film is affected by the carrier scattering, but the graphene layers stacked in the turbostratic structure on top of the bottom graphene layer is less affected by the carrier scattering occurring in the underlying insulation film. As a result, the electron field-effect mobility in the entire graphene layers can be improved, and thus the performance of the electronic device using graphene according to the present embodiment can be improved.

Note here that the structure of the electronic device using graphene according to the present embodiment can also be applied to other embodiments.

Embodiment 13

The electronic device using graphene according to Embodiment 13 of the present disclosure is different from other embodiments in that the graphene layer is provided as a flat layer. Since other parts with the same symbols are formed and structured in the same manner as in the electronic devices using graphene according to other embodiments, the description is omitted.

Figure 19:
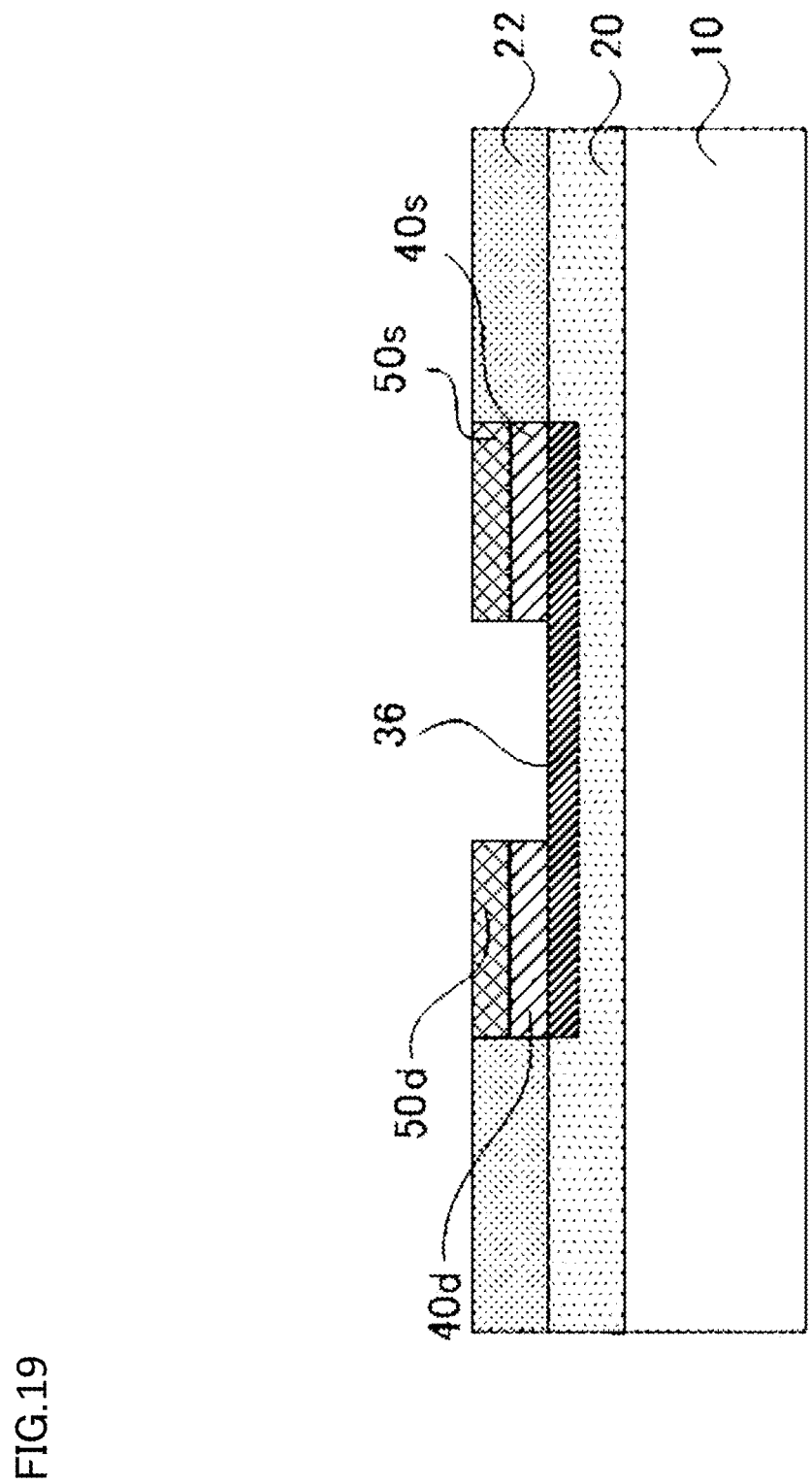
FIG. 19 is a cross section showing the structure of an electronic device using graphene according to Embodiment 13 of the present disclosure.

FIG. 19 is a cross section showing the structure of the electronic device using graphene according to the present embodiment, which is along the section line A-A in FIG. 1, as in the case of Embodiment 1.

As shown in FIG. 19, the electronic device using graphene according to the present embodiment is provided with a graphene layer 36 as a flat layer unlike Embodiment 1. Therein, the graphene layer 36 is not of a winner podium shape as in Embodiment 1 but of a continuous and flat shape, which is entirely embedded in the insulation film 20. Therefore, the upper surface of the graphene layer 36 is, in its entirety, flush with the upper surface of the insulation film 20.

Figure 20:
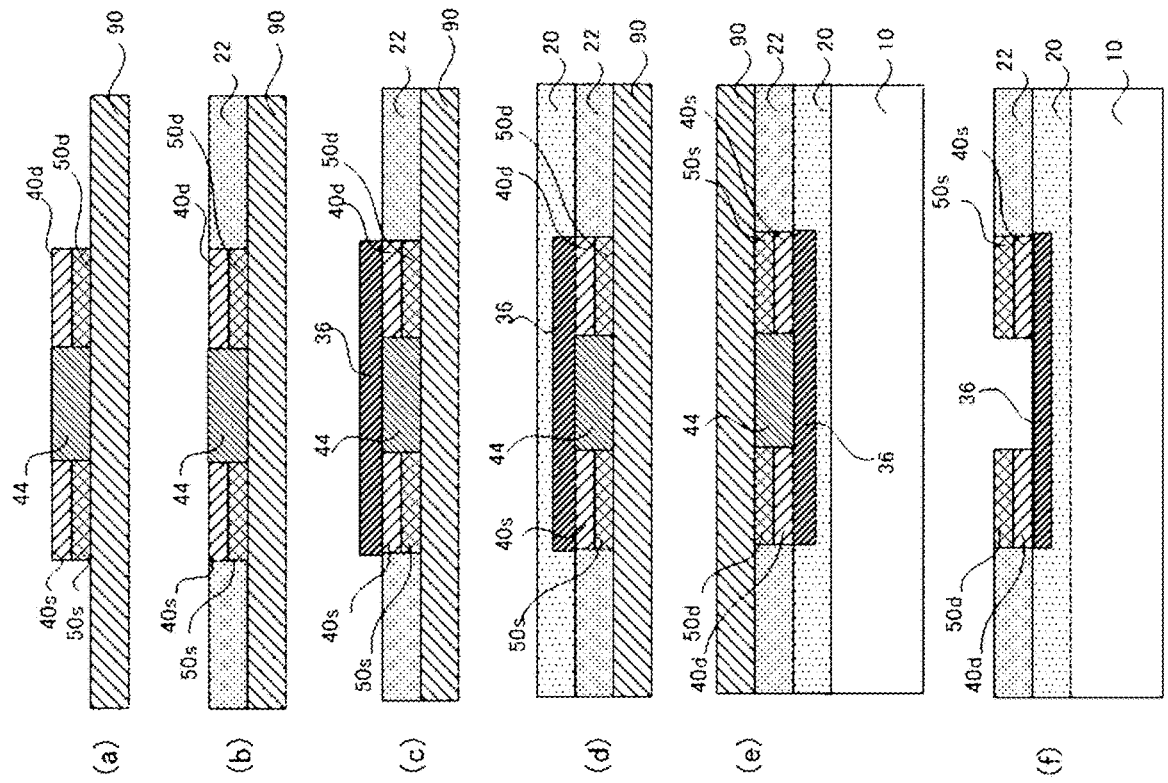
FIG. 20 is a cross section showing the manufacturing method for the electronic device using graphene according to Embodiment 13 of the present disclosure.

Next, the manufacturing method for the electronic device using graphene according to the present embodiment will be described. FIG. 20 is a cross section showing the manufacturing method for the electronic device using graphene according to the present embodiment.

First, for example, a substrate 90 such as a silicon substrate is prepared, and a resist mask having an opening is formed on the substrate 90 using photolithography or EB lithography. After that, the respective metal layers of the electrodes 50s, 50d and the catalytic metals 40s, 40d are deposited in this order using EB evaporation or a sputter deposition method. Next, the metal films formed except for in the opening is lifted off together with the resist mask. As a result, as shown in FIG. 20(a), the portions to become the catalytic metals 40s, 40d and the electrodes 50s, 50d are left, and the unnecessary portions for forming the catalytic metals 40s, 40d and the electrodes 50s, 50d are removed. Thus, the catalytic metals 40s, 40d and the electrodes 50s, 50d are formed on the substrate 90. The next process includes the following steps: a resist mask having an opening only between the catalytic metals 40s, 40d and the electrodes 50s, 50d is formed by using photolithography or EB lithography; a metal film made of, for example, Cu, is deposited in the opening; the metal film formed except for in the opening is lifted off together with the resist mask to leave the portion to become the catalytic metal 44 and remove the unnecessary portion for forming the catalytic metal 44. This is how the catalytic metal 44 is formed on the substrate 90 as shown in FIG. 20(a). At this time, the thicknesses of the catalytic metals 40s, 40d and the catalytic metal 44 are adjusted so that the upper surfaces of these metal films will be flush with each other.

As the metal material of the catalytic metal 44, for example, Cu, Ni, Al, Fe, Co, W, Cr, or the like can be used. The substrate 90 is not limited to a silicon substrate. Alternatively, since it is not used, unlike Embodiment 1, as the catalytic metal, it can be removed in a later step. Therefore, any material can be used as long as it can support the electronic device using graphene according to the present embodiment, including the material used for the substrate 10 of Embodiment 1.

Next, by using vapor deposition, the CVD method, or an atomic layer deposition (ALD) method, etc., a passivation film 22 made of, for example, a silicon oxide film is formed to cover the substrate 90, the catalytic metals 40s, 40d, 44 and the electrodes 50s, 50d. Then, the passivation film 22 covering the catalytic metals 40s, 40d, and 44 on the substrate 90 is removed by, for example, etching, the resulting configuration of which is shown in FIG. 20(b).

Next, as shown in FIG. 20(c), the graphene layer 36 is formed selectively on the upper surfaces of the catalytic metals 40s, 40d, 44 exposed from the passivation film 22 by using, for example, the thermal CVD method or the plasma CVD method. For example, in a case of the thermal CVD method, the graphene layer 36 is formed by heating the inside of the CVD chamber to 1000 degrees C. and injecting H2 gas and CH4 gas into the CVD chamber. Since the upper surfaces of the catalytic metals 40s, 40d and 44 are flat and flush, the graphene layer 36 is formed flat. For example, in a case of the plasma CVD method, it is possible to use the low temperature plasma CVD method so that the metal materials of the catalytic metals 40s, 40d, 44 and the electrodes 50s, 50d, will not melt or become an alloy together.

Here, for example, by using Ni for the catalytic metals 40s, 40d and Cu for the catalytic metal 44, the multi-layered graphene is formed selectively on the catalytic metals 40s, 40d; the single-layered graphene is formed selectively on the catalytic metal 44, as in Embodiment 2. As a result, the single-layered graphene layer and the multi-layered graphene layer are formed continuously and flatly.

Next, as shown in FIG. 20(d), the insulation film 20 made of, for example, silicon oxide is formed on the upper surfaces of the graphene layer 36 and on the passivation film 22 by using, for example, a solution coating method such as spin coating method, a physical evaporation method such as a vacuum evaporation method, or a chemical evaporation method such as a CVD method. Then, in order to bond the upper surface of the insulation film 20 and the substrate 10, the upper surface of the insulation film 20 should be planarized.

Next, as shown in FIG. 20(e), the upper surface of the flattened insulation film 20 and the substrate 10 are attached and bonded to each other.

The method of attaching and bonding the upper surface of the insulation film 20 and the substrate 10 together is the same as that in Embodiment 1, and the description thereof is omitted.

Then, as shown in FIG. 20(f), the substrate 90 and the catalytic metal 44 are removed by an etching method or a peeling method. The method of removing the substrate 90 is the same as that of Embodiment 1, and the description will be omitted. However, in a case of removing the catalytic metal 44, a material with which the catalytic metal 44 is selectively dissolved should be used. For example, when the catalytic metal 44 is a copper foil, a copper-selective etching solution is used. Thereby, the catalytic metal 44 can be selectively removed.

As described above, the electronic device using graphene according to the present embodiment can be produced.

Next, effects of the electronic device using graphene and its manufacturing method according to the present embodiment will be described.

In the electronic device using graphene according to the present embodiment, after the graphene layer 36 is formed, it does not suffer the process damages due to the previously-mentioned processing steps performed when forming the channel region: etching, forming the resist mask when forming the electrodes, and forming the metal film. Therefore, the electronic device using graphene according to the present embodiment can improve the performance. The details are the same as Embodiment 1 and are omitted here.

Further, the electronic device using graphene according to the present embodiment can be produced without using the conventional transfer process in water as in Embodiment 1, and thus the mass productivity can be improved. In addition, in the electronic device using graphene according to the present embodiment, as in Embodiment 1, the graphene layer 32 is selectively grown from the catalytic metals 40s, 40d, and thus the graphene layer 32 is provided on the entire bottom surfaces of the catalytic metals 40s, 40d. As a result, the contact resistance between the graphene layer 32 and the catalytic metals 40s, 40d can be suppressed, and thus the performance of the electronic device using graphene can be improved.

Further, in the electronic device using graphene according to the present embodiment, the graphene layer is provided as a flat layer, so that the mobility reduction of the light carrier due to the bending of the graphene layer is suppressed as compared with Embodiment 1. As a result, the electromagnetic wave detection sensitivity of the electromagnetic wave detector with the electronic device using graphene according to the present embodiment can be increased.

Note here that the structure of the electronic device using graphene according to the present embodiment can also be applied to other embodiments.

Embodiment 14

In an electronic device using graphene according to Embodiment 14 of the present disclosure, as the material of the insulation film 20, a material that causes an electric potential change of the graphene layer 30 due to the property changes occurring in the material when irradiated by electromagnetic waves is used. Since other parts with the same symbols are formed and structured in the same manner as in the electronic devices using graphene according to other embodiments, the description is omitted.

Here, such a material, subject to property changes due to the irradiation of the electromagnetic waves and thus causing an electric potential change in the graphene layer 30, includes, for example, quantum dots, ferroelectric materials, liquid crystal materials, fullerenes, rare earth oxides, semiconductor materials, pn junction materials, metal-semiconductor junction materials, or metal-insulator-semiconductor junction materials. For example, when a ferroelectric material having a polarization effect (pyroelectric effect) due to electromagnetic waves is used as the above-mentioned ferroelectric material, a polarization change occurs in the ferroelectric material due to the irradiation of the electromagnetic waves, thereby causing an electric potential change in the graphene layer 30.

Next, effects of the electronic device using graphene and its manufacturing method according to the present embodiment will be described.

In the electronic device using graphene according to the present embodiment, after the graphene layer 30 is formed, it does not suffer the process damages due to the previously-mentioned processing steps performed when forming the channel region: etching, forming the resist mask when forming the electrodes, and forming the metal film. Therefore, the electronic device using graphene according to the present embodiment can improve the performance. The details are the same as Embodiment 1 and are omitted here. Further, the electronic device using graphene according to the present embodiment can be produced without using the conventional transfer process in water as in Embodiment 1, and thus the mass productivity can be improved. In addition, in the electronic device using graphene according to the present embodiment, as in Embodiment 1, the graphene layers 30 is selectively grown from the catalytic metals 40s, 40d, and thus the graphene layers 30 are provided on the entire bottom surfaces of the catalytic metals 40s, 40d. As a result, the contact resistance between the graphene layer 30 and the catalytic metals 40s, 40d can be suppressed, and thus the performance of the electronic device using graphene can be improved.

Figure 21:
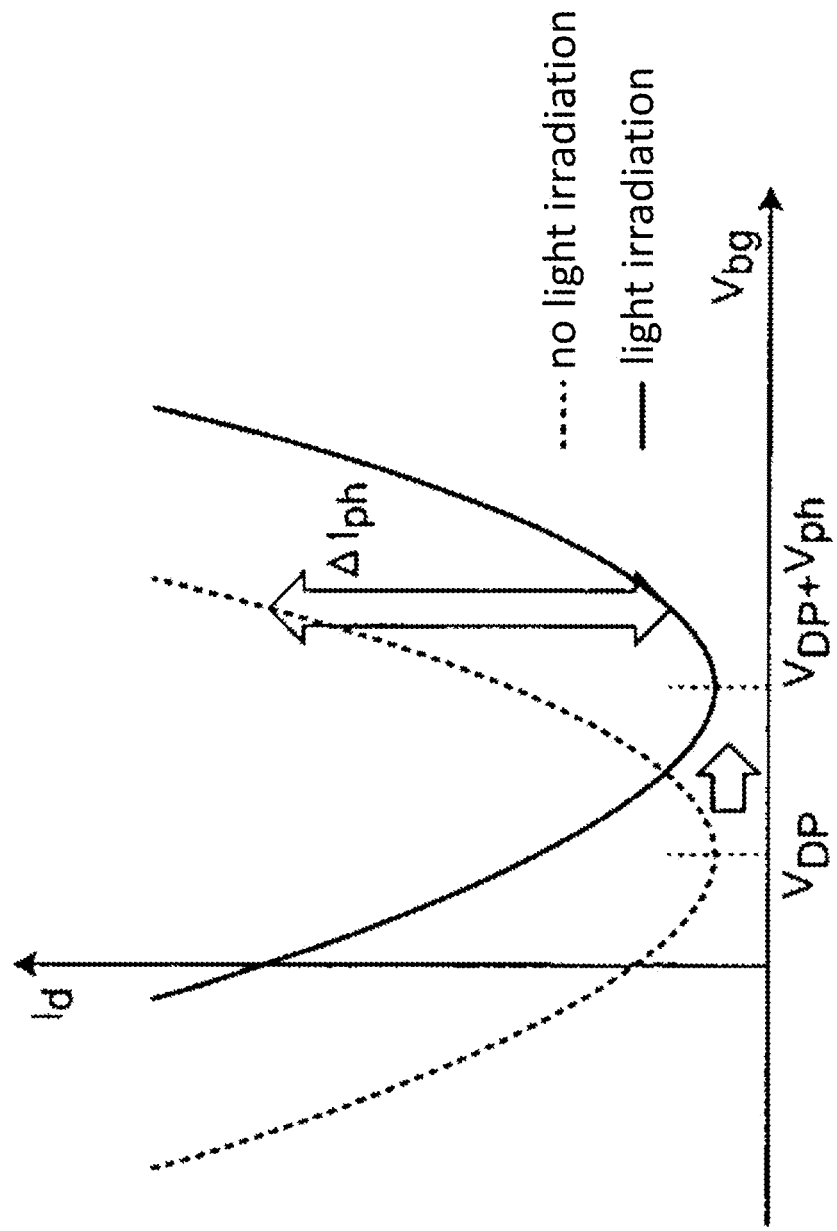
FIG. 21 is a diagram for explaining the effects of an electronic device using graphene according to Embodiment 14 of the present disclosure.

Further, in the electronic device using graphene according to the present embodiment, as a material of the insulation film 20, a material, subject to property changes due to the irradiation of the electromagnetic waves and thus causing an electric potential change in the graphene layer 30, is used. Next, the effect will be described in detail. FIG. 21 is a diagram for explaining the effect of the electronic device using graphene according to the present embodiment, in which the relationship between the gate voltage Vbg applied from the substrate 10 and the current Id flowing in the graphene layer 30 is shown.

An electromagnetic wave detector according to the present embodiment exhibits the characteristics of the gate voltage Vbg-current Id relation as indicated by the broken line in FIG. 21 when the electronic device using graphene according to the present embodiment is not irradiated by the electromagnetic waves. This is a curve indicating a bipolar transistor operation in normal graphene. Here, the gate voltage Vbg that gives the Dirac point is denoted by VDP.

On the other hand, when the electronic device using graphene is irradiated by the electromagnetic waves, a property change occurs in the insulation film 20 due to the irradiation of the electromagnetic waves, and as a result, the gate voltage applied to the graphene layer 30 changes. When the change in the gate voltage caused by the change in the property of the insulation film 20 is denoted by Vph, the characteristics of the gate voltage Vbg—current Id relation when the electronic device using graphene is irradiated by the electromagnetic waves is indicated as the solid line in FIG. 21, in which the gate voltage that gives the Dirac point is shifted from VDP to VDP+Vph.

That is, when the electronic device using graphene is irradiated by the electromagnetic waves, the characteristics in the relation of the gate voltage Vbg-current Id shifts from the curve shown by the broken line to the curve shown by the solid line in FIG. 21. Therefore, in the graphene layer 30 between the electrodes 50s, 50d, the differential current of ΔIph, which is a change of electricity in the graphene layer 30 due to the property change of the insulation film 20, is generated.

Such an effect is called a photo-gating effect or a photo-switch. The irradiation of the electromagnetic waves can be detected by measuring the differential current ΔIph as the resultant change of electricity caused by the effect.

When single-layered graphene is used in the graphene layer 30, the graphene layer 30 is a thin film having a thickness of a single atomic layer, so that the electron mobility is large. As a result, a large current change is generated for a small, electric potential change as compared to normal semiconductors. For example, the amount of current change ΔIph with respect to the electric potential change applied to the graphene layer 30 by the change in the gate voltage Vph is several hundreds to several thousand times larger as compared with normal semiconductors when calculated from the electron mobility and the film thickness.

Therefore, by using the photo-gating effect, the extraction efficiency of the detection current in the graphene layer 30 is significantly increased as compared with the photoelectric conversion efficiency of the graphene which is low if used as is. Such a photo gating effect does not directly enhance the quantum efficiency of the photoelectric conversion material, but increases the current change caused by the electromagnetic wave irradiation. Therefore, the quantum efficiency equivalently calculated from the differential current due to the electromagnetic wave irradiation can exceed 100%. Thus, the electromagnetic wave detector with high sensitivity, compared with conventional electromagnetic wave detectors, can be obtained.

In addition to the differential current mentioned above, a photocurrent corresponding to the photoelectric conversion efficiency inherent to the graphene, explained in other embodiments, is also generated. Therefore, when the graphene layer 30 is irradiated by the electromagnetic waves, the photocurrent corresponding to the inherent photoelectric conversion efficiency of the graphene can be detected in addition to the differential current due to the photo gating effect described above.

Here, an example has been described in which the insulating film 20 is made of a material whose characteristics change due to the irradiation of electromagnetic waves and which changes the potential of the graphene layer 30. However, the above is not a limitation, but any of the substrate 10 and the contact layers 60, 62, and 64, for example, may be candidates. Also, such a material, subject to property changes due to the irradiation of the electromagnetic waves and thus causing an electric potential change in the graphene layer 30, may be used in one or more of the insulation film 20, the substrate 10, and the contact layers 60, 62, and 64. In a case where such a material, subject to property changes due to the irradiation of the electromagnetic waves and thus causing an electric potential change in the graphene layer 30, is applied to, for example, the contact layers 60, 62, and 64, they are not necessarily need to be provided in direct contact with the graphene layer as long as the electric potential change can be generated in the graphene layer but may be provided on the upper surface or on the bottom surface of the graphene layer via the insulation film and the like.

Note here that the structure of the electronic device using graphene according to the present embodiment can also be applied to other embodiments.

Embodiment 15

Figure 22:
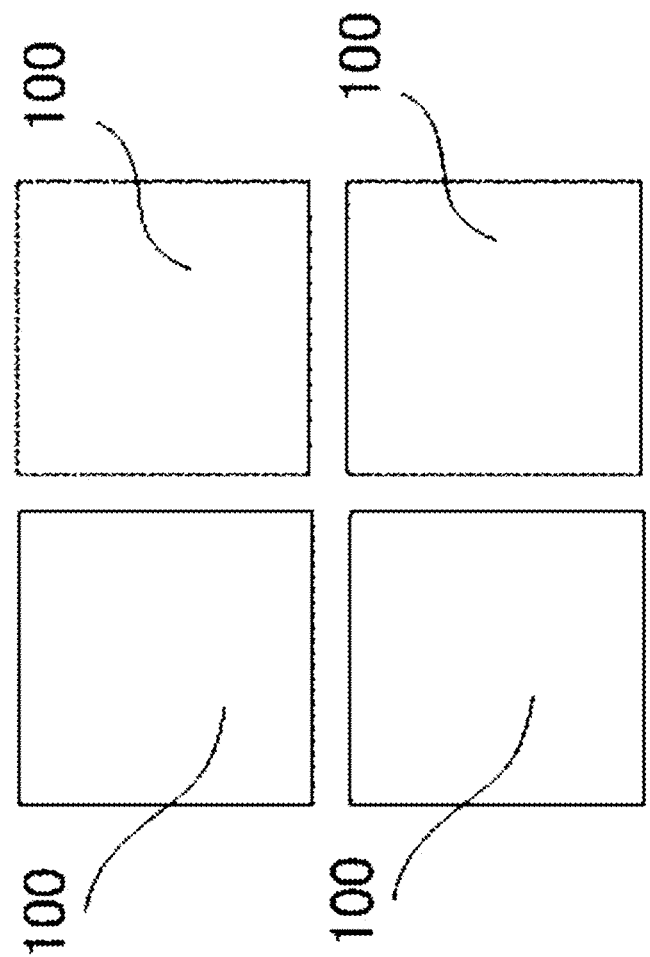
FIG. 22 is a plan view showing the structure of an electromagnetic wave detector according to Embodiment 15 of the present disclosure.
Figure 23:
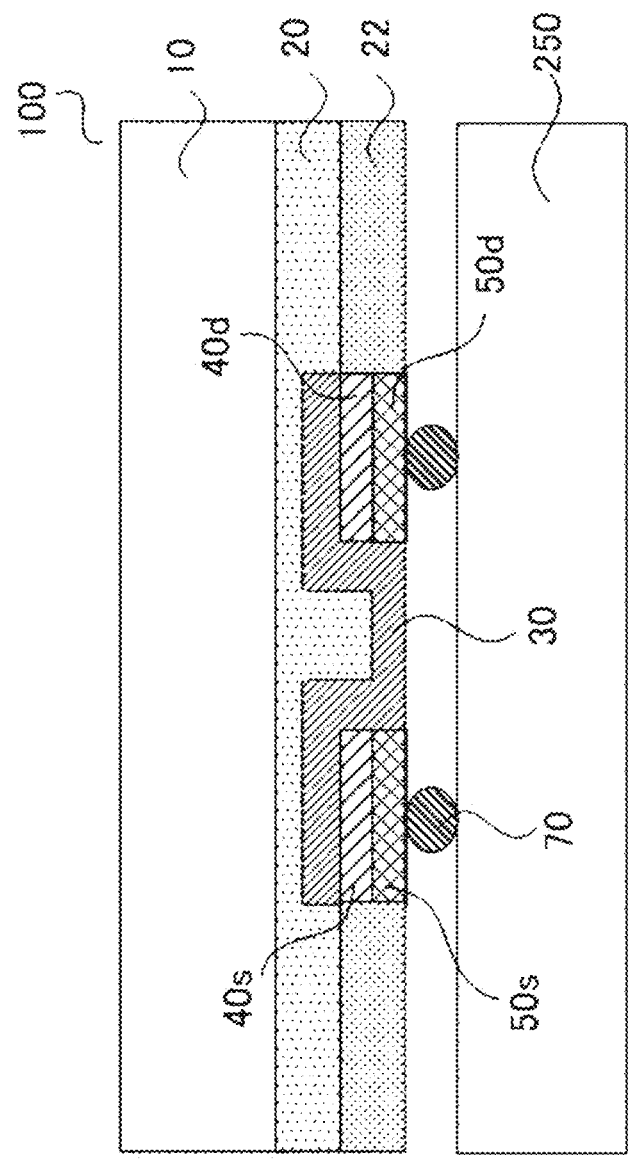
FIG. 23 is a cross section showing the structure of the electromagnetic wave detector according to Embodiment 15 of the present disclosure.
Figure 24:
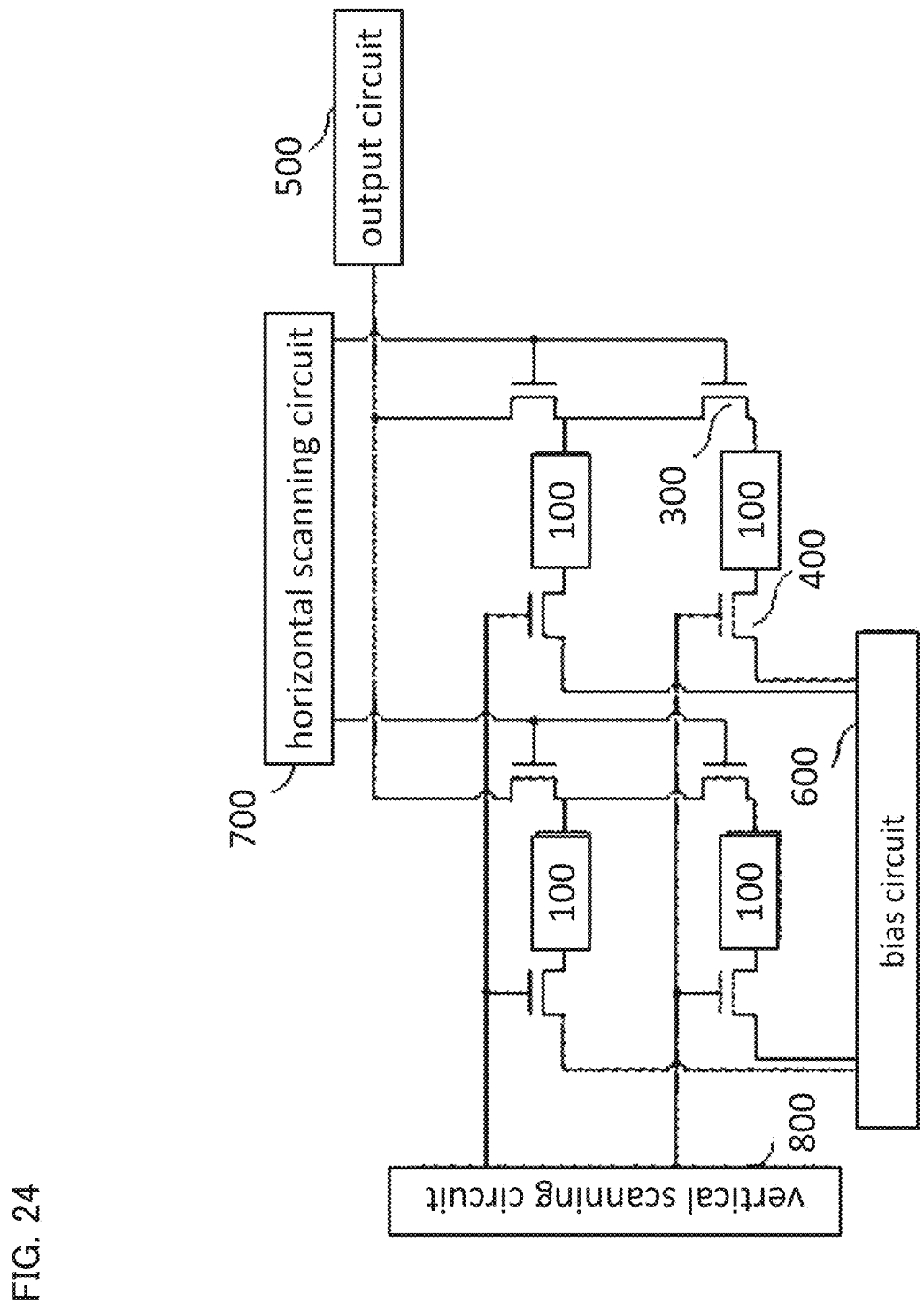
FIG. 24 is a circuit diagram showing the configuration of an electromagnetic wave detector according to Embodiment 15 of the present disclosure.

In an electromagnetic wave detector according to Embodiment 15 of the present disclosure, a plurality of the electronic devices using graphene according to Embodiment 1 are provided as detection elements, and they are arranged in a one-dimensional or two-dimensional array. FIG. 22 is a plan view showing the structure of the electromagnetic wave detector according to the present embodiment. FIG. 23 is a cross section showing the structure of the electromagnetic wave detector according to the present embodiment. FIG. 24 is a circuit diagram showing the configuration of the electromagnetic wave detector according to the present embodiment.

As shown in FIG. 22, the electromagnetic wave detector according to the present embodiment has a plurality of the electronic devices using graphene 100 according to Embodiment 1 as detection elements, which is arranged in a two-dimensional array. In the present embodiment, the electronic devices using graphene 100 according to Embodiment 1 are arranged in a 2×2 array. However, the number of the electronic devices using graphene 100 to be arranged is not limited to the above. Further, in the present embodiment, they are arranged in a periodic two-dimensional array. Alternatively, however, they may be arranged in a periodic one-dimensional array. Furthermore, they may be arranged at different intervals rather than periodically.

The electromagnetic wave detector with the electronic devices using graphene arranged in this way can detect electromagnetic waves in a very wide wavelength range from ultraviolet light to microwave. Especially, the electromagnetic wave detector with the electronic devices using graphene arranged in an array can be used as an image sensor. For example, in a case where the electromagnetic wave detector is applied to a vehicle-mounted sensor, it can be used as a visible light image camera in the daytime and as an infrared camera at night. Therefore, it is not necessary to switch a plurality of cameras each having a different image sensor depending on the detection wavelength of the electromagnetic waves.

As shown in FIG. 23, the electromagnetic wave detector according to the present embodiment includes the electronic devices using graphene 100 and a readout circuit board 250, for reading electrical signals obtained by each of the electronic devices using graphene 100 arranged in an array described above. The electrodes 50s, 50d of each of the electronic devices using graphene 100 are electrically connected to the readout circuit board 250 via bumps 70.

Here, in the present embodiment, the readout circuit board 250 is provided separately from the electronic devices using graphene 100, but alternatively a readout circuit, described below, may be provided on the same substrate on which the electronic devices using graphene 100 are provided. In order to join the electronic devices using graphene 100 and the readout circuit board 250, alignment marks should be provided on both the electronic devices 100 and the readout circuit board 250.

Further, as shown in FIG. 24, in the electromagnetic wave detector according to the present embodiment, a column selection transistor 300 and a row selection transistor 400 are connected to each of the electronic devices using graphene 100 arranged in an array described above. An output circuit 500 that outputs signals of the electromagnetic waves detected by the electronic devices using graphene 100 is connected to the other end of the column selection transistor 300. A bias circuit 600 that applies a bias voltage Vd to the electronic devices using graphene 100 is connected to the other end of the row selection transistor 400.

The gate of the column selection transistor 300 is connected to horizontal signal lines each provided for each column; each horizontal signal line is connected to a horizontal scanning circuit 700; the horizontal scanning circuit 700 drives the horizontal signal line of each column to control the column selection transistor 300 on a column-by-column basis. The gate of the row selection transistor 400 is connected to vertical signal lines each provided for each row; each vertical signal line is connected to a vertical scanning circuit 800; the vertical scanning circuit 800 drives the vertical signal line of each row to control the row selection transistor 400 on a row-by-row basis. That is, each column and each row are selected by the horizontal scanning circuit 700 and the vertical scanning circuit 800, respectively, and as a result, the corresponding electronic device using graphene 100, which is one detection element, is selected.

In the present embodiment, in a case of the electromagnetic wave detector structured as shown in FIG. 23, the column selection transistor 300, the row selection transistor 400, the output circuit 500, the bias circuit 600, the horizontal scanning circuit 700, and the vertical scanning circuit 800, described in FIG. 24, are integrated on the readout circuit board 250.

Next, the operation of the electromagnetic wave detector according to the present embodiment will be described with reference to FIG. 24.

First, the vertical scanning circuit 800 selects one vertical signal line and applies a voltage. The horizontal scanning circuit 700 selects one horizontal signal line. As a result, one electronic device using graphene 100 is selected.

After that, when the bias voltage Vd is applied from the bias circuit 600, the current Id flows through the selected electronic device using graphene 100 and is outputted to the output circuit 500.

The output circuit 500 outputs the current Id flowing in the selected electronic device using graphene 100 as the signals of electromagnetic waves detected by the electronic device using graphene 100 in the form of electrical signals.

Then, the next electronic device using graphene 100 is selected by the horizontal scanning circuit 700 and the vertical scanning circuit 800, and the above-mentioned operation is performed. By repeating this operation for all the electronic devices using graphene 100, the image signals of the electromagnetic waves detected by the electromagnetic wave detector are outputted as electrical signals.

As described above, the electromagnetic wave detector with the electronic devices using graphene according to the present embodiment, configured as described above, can detect electromagnetic waves in a wide wavelength range by using graphene.

Although the electromagnetic wave detector having a plurality of the electronic devices using graphene according to Embodiment 1 is exemplified in the description of the present embodiment, it is possible to use the electromagnetic wave detector having a plurality of the electronic devices using graphene according to embodiments other than Embodiment 1.

Embodiment 16

Figure 25:
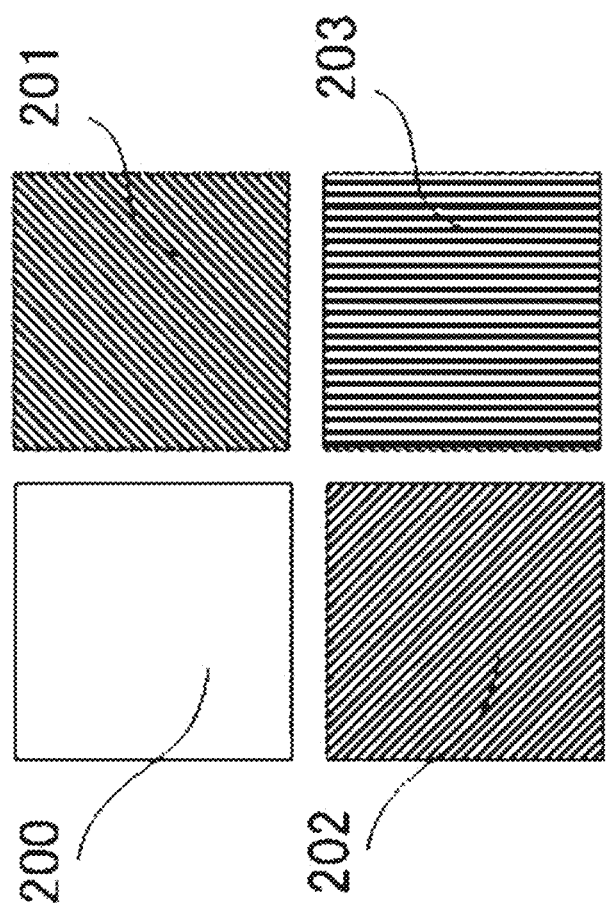
FIG. 25 is a plan view showing the structure of the electromagnetic wave detector according to Embodiment 16 of the present disclosure.

An electromagnetic wave detector according to Embodiment 16 of the present disclosure is different from Embodiment 15 in that a plurality of electronic devices using graphene different from each other are provided, and they are arranged in a one-dimensional or two-dimensional array. FIG. 25 is a plan view showing the structure of the electromagnetic wave detector according to the present embodiment. Here, the structure in the cross section and the circuit configuration of the electromagnetic wave detector according to the present embodiment are the same as those of Embodiment 15, and thus the description thereof is omitted.

As shown in FIG. 25, in the electromagnetic wave detector according to the present embodiment, electronic devices using graphene 200, 201, 202, 203 of different types are arrayed in a 2×2 matrix. The number of the electromagnetic wave detectors arrayed is not limited to the above. Further, in the present embodiment, they are arranged in a periodic two-dimensional array. Alternatively, however, they may be arranged in a periodic one-dimensional array. Furthermore, they may be arranged at different intervals rather than periodically.

In the electromagnetic wave detector according to the present embodiment, the different types of the electronic devices using graphene each described in Embodiments 1 to 12 are arranged in a one-dimensional or two-dimensional array. This allows the electromagnetic wave detector to have a function as an image sensor. For example, the electronic devices using graphene 200, 201, 202, and 203 may be assigned to the electronic devices using graphene with different detection wavelengths. Specifically, from among the electronic devices using graphene described in Embodiments 1 to 12, a plurality of the electronic devices using graphene capable of selectively detecting different wavelengths are selected and arranged in an array. This allows the electromagnetic wave detector to detect at least two electromagnetic waves of different wavelengths.

In this way, by arranging the electronic devices using graphene with different detectable wavelengths in an array in the electromagnetic wave detector, the detector can discriminate wavelengths even in ultraviolet light, near-infrared light, terahertz wave, and wavelength range of radio waves, and thus can obtain a colorized image, as an image sensor does in the visible light range.

Further, as an application except for the image sensor, it can be used as a position detecting sensor for an object even with fewer pixels. An image sensor that detects the intensities of electromagnetic waves of different wavelengths can be obtained by devising the structure of the electromagnetic wave detector. The image sensor thus obtained can detect the electromagnetic waves of different wavelengths without using a color filter, which is conventionally required in a CMOS image sensor or the like, and as a result, a color image can be obtained.

Furthermore, an image sensor capable of polarization discrimination can be obtained by forming an array of the electronic devices using graphene with different detectable polarizations. For example, when one unit in an array is a set of four pixels whose respective detectable polarization angles are 0°, 90°, 45°, and 135°, polarization imaging can be performed by arranging the plurality of such pixel sets in the array. The image sensor capable of polarization discrimination enables, for example, identification of artificial and natural objects, material identification, identification of objects at the same temperature in the infrared wavelength range, identification of boundaries between objects, or improvement of equivalent resolution.

As described above, the electromagnetic wave detector with the electronic devices using graphene thus structured according to the present embodiment can detect electromagnetic waves in a wide wavelength range, as in Embodiment 15. Further, the electromagnetic wave detector with the electronic devices using graphene according to the present embodiment can detect electromagnetic waves of different wavelengths.

In the present disclosure, each embodiment can be freely combined or appropriately modified or omitted within the scope of the invention. Furthermore, the present invention is not limited to the embodiments described above and can be variously modified at the stage of implementation without departing from the gist of the invention. Lastly, since the embodiments described above include inventions at various stages, a variety of inventions can be created by appropriately combining a plurality of constituent features disclosed.

DESCRIPTION OF REFERENCE NUMERALS AND SIGNS

10 substrate, 20 insulation film, 22 passivation film, 30 graphene layer, 40s, 40d, 42 catalytic metal, 50s, 50d electrode

The invention claimed is:

1. A manufacturing method for an electronic device using graphene, comprising:

forming a first catalytic metal by a first semiconductor process;

forming an electrode having a second catalytic metal by a second semiconductor process;

forming a passivation film and exposing upper surfaces of the first catalytic metal and the second catalytic metal from the passivation film by a third semiconductor process;

forming, after the exposing step, a graphene layer on each of the surfaces of the first catalytic metal and the second catalytic metal which are exposed from the passivation film;

forming, after the graphene layer is formed, an insulation film so as to cover the graphene layer;

forming, after the insulation film is formed, a first substrate on the insulating film; and removing, after the graphene layer is formed, the first catalytic metal while the electrode including the second catalytic metal is left.

2. The manufacturing method for the electronic device using graphene according to claim 1, wherein the exposing step comprises:

forming, after the first catalytic metal and the electrode are formed, the passivation film by a fourth semiconductor process; and removing the passivation film by a fifth semiconductor process so that the upper surfaces of the first catalytic metal and the second catalytic metal are exposed, wherein the fourth semiconductor process and the fifth semiconductor process are included in the third semiconductor process.

3. The manufacturing method for the electronic device using graphene according to claim 1, wherein the graphene layer includes forming, after the exposing step, the graphene layer simultaneously on each surface of the first catalytic metal and the second catalytic metal, each surface being exposed from the passivation film.

4. The manufacturing method for the electronic device using graphene according to claim 1, wherein the first substrate includes attaching the insulation film and the first substrate to each other by bonding.

5. The manufacturing method for the electronic device using graphene according to claim 2, wherein the electrode comprises depositing, after the first catalytic metal is formed, the second catalytic metal on the first catalytic metal and exposing the first catalytic metal while a portion of the second catalytic metal is left.

6. The manufacturing method for the electronic device using graphene according to claim 2, wherein, in the first catalytic metal and the electrode, the first catalytic metal and the second catalytic metal are formed so as to be adjacent to each other on a second substrate and the upper surfaces of the first catalytic metal and the second catalytic metal are flush with each other.

7. The manufacturing method for the electronic device using graphene according to claim 1, wherein, in the graphene layer, a single-layer graphene layer is formed on the first catalytic metal and multi-layer graphene layer is formed on the second catalytic metal, and in the removing the first catalytic metal, the first catalytic metal on an entire surface of which the single-layer graphene layer is formed is removed while the electrode including the second catalytic metal on the entire surface of which the multi-layer graphene layer is formed is left.

8. The manufacturing method for the electronic device using graphene according to claim 5, wherein the electrode comprises depositing a first metal film on the first catalytic metal after the first catalytic metal; and in the electrode, after the first metal film is deposited, the second catalytic metal is deposited on the first metal film and the first catalytic metal is exposed while a portion of the first metal and a portion of the second catalytic metal which are to be the electrode are left.

9. The manufacturing method for the electronic device using grapheme according to claim 6, wherein the electrode comprises depositing a second metal film on the second substrate; and, in the electrode, after the second metal film is deposited, the second catalytic metal is deposited on the second metal film, and the second metal film and the second catalytic metal are removed while a portion of the second metal film and a portion of the second catalytic metal which are to be the electrode are left.

10. The manufacturing method for the electronic device using graphene according to claim 8, wherein of the electrode comprises depositing a third metal film made of a metal material different in kind from that of the first metal film on the first catalytic metal after the forming the first catalytic metal; and in the electrode, after the third metal film is deposited, the second catalytic metal is deposited on the third metal film, and the first catalytic metal is exposed while a portion of the third metal and a portion of the second catalytic metal which are to be the electrode are left.

11. The manufacturing method for the electronic device using graphene according to claim 1 comprising at least one of the following steps:

forming a contact layer that is in contact with an upper surface or a bottom surface of the graphene layer and that can supply holes or electrons to the graphene layer;

forming on the graphene layer, at least one fifth electrode that is floating; and forming a space between the graphene layer and the first substrate.

12. The manufacturing method for the electronic device using graphene according to claim 1 comprising removing a portion of the insulation film and exposing a portion of the graphene layer, wherein, in the first substrate on the insulation film, the graphene layer exposed by removal of the insulation film and the first substrate are made in contact with each other.

13. The manufacturing method for the electronic device using graphene according to claim 12, wherein, in the removing the portion of the insulation film and exposing the portion of the graphene layer, a portion of a channel region of the graphene layer is exposed, and in the first substrate on the insulation film, the portion of the exposed channel region of the graphene layer is made in contact with the first substrate, and a portion of the non-exposed channel region of the graphene layer is made in contact with the insulation film.

14. The manufacturing method for the electronic device using graphene according to claim 1, further comprising forming graphene having at least one layer of a turbostratic structure on the graphene layer.

15. The manufacturing method for the electronic device using graphene according to claim 1, wherein at least one of the first substrate and the insulation film is made of a material subject o property changes due to radiation of electromagnetic waves and thus causing an electric potential change in the graphene layer.

16. The manufacturing method for the electronic device using graphene according to claim 11, wherein the contact layer is made of a material subject to property changes due to radiation of electromagnetic waves and thus causing an electric potential change in the graphene layer.

17. The manufacturing method for the electronic device using graphene according to claim 1, wherein the electronic device is an electromagnetic wave detector.

18. The manufacturing method for the electronic device using graphene according to claim 1, wherein the electronic device is a transistor.

19. The manufacturing method for the electronic device using graphene according to claim 1, wherein the electronic device is a diode.

20. The manufacturing method for the electronic device using graphene according claim 19, wherein the diode is a Schottky diode.

* * * * *